(12) United States Patent
Dau et al.

(10) Patent No.: US 8,833,996 B2
(45) Date of Patent: Sep. 16, 2014

(54) ILLUMINATION SYSTEMS PROVIDING DIRECT AND INDIRECT ILLUMINATION

(71) Applicant: Quarkstar LLC, Las Vegas, NV (US)

(72) Inventors: Wilson Dau, Calgary (CA); Louis Lerman, Las Vegas, NV (US); Ingo Speier, Saanichton (CA)

(73) Assignee: Quarkstar LLC, Las Vegas, NV (US)

( * ) Notice: Subject to any disclaimer, the term of this patent is extended or adjusted under 35 U.S.C. 154(b) by 0 days.

(21) Appl. No.: 14/140,327

(22) Filed: Dec. 24, 2013

(65) Prior Publication Data

US 2014/0192558 A1    Jul. 10, 2014

Related U.S. Application Data

(63) Continuation of application No. PCT/US2013/059416, filed on Sep. 12, 2013.

(60) Provisional application No. 61/780,301, filed on Mar. 13, 2013, provisional application No. 61/700,641, filed on Sep. 13, 2012.

(51) Int. Cl.

| | | |
|---|---|---|
| F21V 8/00 | (2006.01) | |
| F21K 99/00 | (2010.01) | |
| H01L 33/58 | (2010.01) | |
| G02B 6/12 | (2006.01) | |
| F21V 29/00 | (2006.01) | |
| F21S 8/06 | (2006.01) | |
| G02B 6/00 | (2006.01) | |
| F21Y 101/02 | (2006.01) | |
| F21Y 103/00 | (2006.01) | |

(52) U.S. Cl.
CPC . *G02B 6/005* (2013.01); *F21K 9/52* (2013.01); *G02B 6/0073* (2013.01); *G02B 6/001* (2013.01); *H01L 33/58* (2013.01); *G02B 6/12004* (2013.01); *G02B 6/0011* (2013.01); *F21V 29/225* (2013.01); *F21S 8/06* (2013.01); *F21V 7/008* (2013.01); *G02B 6/00* (2013.01); *F21Y 2101/02* (2013.01); *F21Y 2103/003* (2013.01)
USPC ............ 362/558; 362/555; 362/551; 362/404

(58) Field of Classification Search
CPC .... G02B 6/0011; G02B 6/4298; G02B 6/001; G02B 6/0001; G02B 6/0073; G02B 6/0075; G02B 6/12004; F21K 9/52; F21K 9/00; F21Y 2101/02; H01L 33/58
USPC ............ 362/249.02, 240, 551, 555, 558, 404, 362/408
See application file for complete search history.

(56) References Cited

U.S. PATENT DOCUMENTS

| | | | |
|---|---|---|---|
| 2,194,841 | A | 3/1940 | Welch |
| 2,626,120 | A | 1/1953 | Baker |
| 3,772,506 | A | 11/1973 | Junginger |
| 3,836,767 | A | 9/1974 | Lasker |
| 4,112,483 | A | 9/1978 | Small |
| 4,254,456 | A | 3/1981 | Grindle |
| 4,271,408 | A | 6/1981 | Teshima |
| 4,358,817 | A | 11/1982 | Bielemeier |
| 5,075,827 | A | 12/1991 | Smith |
| 5,134,550 | A | 7/1992 | Young |
| 5,289,356 | A | 2/1994 | Winston |
| 5,436,805 | A * | 7/1995 | Hsu et al. ...................... 362/559 |
| 5,438,485 | A | 8/1995 | Li |
| 5,810,463 | A | 9/1998 | Kawahara |
| 5,868,489 | A | 2/1999 | Fuller |
| 5,988,836 | A | 11/1999 | Swarens |
| 6,058,271 | A | 5/2000 | Tenmyo |
| 6,234,643 | B1 | 5/2001 | Lichon |
| 6,241,369 | B1 | 6/2001 | Mackiewicz |
| 6,273,577 | B1 * | 8/2001 | Goto et al. ................... 362/615 |
| 6,441,943 | B1 | 8/2002 | Roberts |
| 6,505,953 | B1 | 1/2003 | Dahlen |
| 6,527,420 | B1 | 3/2003 | Chuang |
| 6,540,373 | B2 | 4/2003 | Bailey |
| 6,543,911 | B1 | 4/2003 | Rizkin |
| 6,572,246 | B1 | 6/2003 | Hopp |
| 6,598,998 | B2 | 7/2003 | West |
| 6,834,979 | B1 | 12/2004 | Cleaver |
| 6,880,963 | B2 | 4/2005 | Luig |
| 6,932,499 | B2 | 8/2005 | Ogura |
| 7,083,315 | B2 | 8/2006 | Hansler |
| 7,097,337 | B2 | 8/2006 | Kim |
| 7,156,540 | B2 | 1/2007 | Haines |

| | | |
|---|---|---|
| 7,164,842 B2 | 1/2007 | Chen |
| 7,182,480 B2 | 2/2007 | Kan |
| 7,259,403 B2 | 8/2007 | Shimizu |
| 7,275,841 B2 | 10/2007 | Kelly |
| 7,286,296 B2 | 10/2007 | Chaves |
| 7,290,906 B2 | 11/2007 | Suzuki |
| 7,293,889 B2 | 11/2007 | Kamiya |
| 7,331,691 B2 * | 2/2008 | Livesay et al. ............... 362/294 |
| 7,334,932 B2 | 2/2008 | Klettke |
| 7,341,358 B2 | 3/2008 | Hsieh |
| 7,386,214 B1 | 6/2008 | Cianciotto |
| 7,387,399 B2 | 6/2008 | Noh |
| 7,434,951 B2 | 10/2008 | Bienick |
| 7,530,712 B2 | 5/2009 | Lin |
| 7,645,054 B2 | 1/2010 | Goihl |
| 7,850,347 B2 | 12/2010 | Speier |
| 7,855,815 B2 | 12/2010 | Hayashide |
| 7,942,546 B2 | 5/2011 | Naijo |
| 7,947,915 B2 | 5/2011 | Lee |
| 7,967,477 B2 | 6/2011 | Bloemen |
| 8,002,446 B1 | 8/2011 | Plunk |
| 8,006,453 B2 | 8/2011 | Anderson |
| 8,042,968 B2 | 10/2011 | Boyer |
| 8,061,867 B2 | 11/2011 | Kim |
| 8,075,147 B2 | 12/2011 | Chaves |
| 8,192,051 B2 | 6/2012 | Dau |
| 8,348,489 B2 | 1/2013 | Holman |
| 8,740,407 B2 | 6/2014 | Kotovsky |
| 2004/0012976 A1 | 1/2004 | Amano |
| 2004/0080947 A1 | 4/2004 | Subisak |
| 2004/0105264 A1 | 6/2004 | Spero |
| 2004/0137189 A1 | 7/2004 | Tellini |
| 2004/0208019 A1 | 10/2004 | Koizumi |
| 2004/0228131 A1 | 11/2004 | Minano |
| 2004/0257803 A1 | 12/2004 | Kermoade |
| 2005/0057922 A1 | 3/2005 | Herst |
| 2005/0063169 A1 | 3/2005 | Erber |
| 2005/0111235 A1 | 5/2005 | Suzuki |
| 2005/0265044 A1 | 12/2005 | Chen |
| 2005/0270774 A1 | 12/2005 | Pan |
| 2006/0061990 A1 | 3/2006 | Chinniah |
| 2006/0076568 A1 | 4/2006 | Keller |
| 2006/0098444 A1 | 5/2006 | Petruzzi |
| 2006/0139917 A1 | 6/2006 | Ward |
| 2006/0164839 A1 | 7/2006 | Stefanov |
| 2006/0187661 A1 | 8/2006 | Holten |
| 2007/0047228 A1 | 3/2007 | Thompson |
| 2007/0061360 A1 | 3/2007 | Holcombe |
| 2007/0081360 A1 | 4/2007 | Bailey |
| 2007/0097696 A1 | 5/2007 | Eng |
| 2007/0201234 A1 | 8/2007 | Ottermann |
| 2007/0207177 A1 | 9/2007 | Murphy |
| 2007/0280593 A1 | 12/2007 | Brychell |
| 2008/0074752 A1 | 3/2008 | Chaves |
| 2008/0198603 A1 | 8/2008 | Sormani |
| 2009/0103293 A1 | 4/2009 | Harbers |
| 2009/0168395 A1 | 7/2009 | Mrakovich |
| 2009/0201698 A1 | 8/2009 | Klick |
| 2009/0231878 A1 | 9/2009 | Van |
| 2010/0085773 A1 | 4/2010 | Richardson |
| 2010/0220497 A1 | 9/2010 | Ngai |
| 2011/0063870 A1 | 3/2011 | Nomoto |
| 2011/0103067 A1 | 5/2011 | Ago |
| 2011/0164398 A1 | 7/2011 | Holten |
| 2011/0175533 A1 | 7/2011 | Holman |
| 2011/0182084 A1 | 7/2011 | Tomlinson |
| 2011/0199005 A1 | 8/2011 | Bretschneider |
| 2011/0227487 A1 | 9/2011 | Nichol |
| 2011/0234121 A1 | 9/2011 | Ding |
| 2011/0267836 A1 | 11/2011 | Boonekamp |
| 2011/0273900 A1 | 11/2011 | Li |
| 2012/0044675 A1 | 2/2012 | Buelow |
| 2012/0069595 A1 * | 3/2012 | Catalano ............... 362/555 |
| 2012/0099310 A1 | 4/2012 | Kropac |
| 2012/0147624 A1 | 6/2012 | Li |
| 2012/0155110 A1 | 6/2012 | Pijlman |
| 2012/0155116 A1 | 6/2012 | Gardner |
| 2012/0170260 A1 | 7/2012 | Gardner |
| 2012/0236586 A1 * | 9/2012 | Wang ............... 362/555 |
| 2012/0268966 A1 | 10/2012 | McCollum |
| 2012/0281432 A1 | 11/2012 | Parker |
| 2012/0294037 A1 | 11/2012 | Holman |
| 2013/0272015 A1 | 10/2013 | Weaver |

FOREIGN PATENT DOCUMENTS

| | | |
|---|---|---|
| CA | 2702690 C | 4/2013 |
| EP | 1182395 A2 | 2/2002 |
| FR | 2934353 A1 | 1/2010 |
| WO | WO03009012 A3 | 5/2003 |
| WO | WO2005073629 A1 | 8/2005 |
| WO | WO2008007315 A1 | 1/2008 |
| WO | WO2009105168 A2 | 8/2009 |
| WO | WO2011112914 A3 | 12/2011 |

OTHER PUBLICATIONS

Authorized Officer Blaine R. Copenheaver, Notification of Transmittal of the International Search Report and the Written Opinion of the International Searching Authority, International Application No. PCT/US2013/059416, mailed Feb. 19, 2014, 9 pages.

Philips Lighting Company, "Philips EnduraLED Candle LED Lamps", Downloaded from the internet at: www.lighting.philips.com/us_en/browseliterature/download/p-6027 on Jan. 27, 2012, 2 pages (2010).

Young, "International Search Report and Written Opinion" from co-pending PCT Application No. PCT/US12/50046 dated Oct. 26, 2012, 34 pages.

Thomas, "International Search Report and Written Opinion" from co-pending PCT Aplication No. PCT/US13/24525 dated Apr. 16, 2013, 16 pages.

Supplementary European Search Report for European Patent Application No. 12822822.8, mailed Jul. 4, 2014, 3 pages.

http://www.everlight.com/datasheets/OL-Flat_Series_Data_Sheet_v5.pdf, "Datasheet: Office Lighting Flat Luminaire Series", product catalog, Everlight, Issue No. DBM-0000054_v5, May 5, 2011, pp. 1-5.

Authorized Officer Shane Thomas, Notification of Transmittal of International Search Report and Written Opinion, International Application No. PCT/US14/27583, mailed Jul. 24, 2014, 12 pages.

Authorized Officer Blaine R. Copenheaver, Notification of Transmittal of the International Search Report and the Written Opinion of the International Searching Authority, International Application No. PCT/US2014/015255, mailed May 19, 2014, 12 pages.

Authorized Officer Shane Thomas, Notification of Transmittal of International Search Report and Written Opinion, International Application No. PCT/US14/15707, mailed May 29, 2014, 21 pages.

*Primary Examiner* — Peggy Neils

(74) *Attorney, Agent, or Firm* — Fish & Richardson P.C.

\* cited by examiner

(57) ABSTRACT

Illumination devices are described for illuminating a target area, e.g., floors of a room, using solid-state light sources. In general, an illumination device includes a first light guide extending along a first plane, the first light guide to receive light from first light emitting elements (LEEs) and guide the light in a first direction in the first plane; a second light guide extending along the first plane, the second light guide to receive light from second LEEs and guide the light in a second direction in the first plane opposite to the first direction; a first redirecting optic to receive light from the first light guide and direct the light in first and second angular ranges; and a second redirecting optic to receive light from the second light guide and direct the light in third and fourth angular ranges, where the first, second, third and fourth angular ranges are different.

6 Claims, 12 Drawing Sheets

ILLUMINATION SYSTEMS PROVIDING DIRECT AND INDIRECT ILLUMINATION

CROSS-REFERENCE TO RELATED APPLICATIONS

This application is a continuation application and claims the benefit of priority under 35 USC 120 to International Application PCT/US2013/059416, filed Sep. 12, 2013, which is a non-provisional application of U.S. Provisional Application No. 61/700,641 filed Sep. 13, 2012, and of U.S. Provisional Application No. 61/780,301 filed Mar. 13, 2013, the disclosures of which are incorporated herein by reference.

TECHNICAL FIELD

The present disclosure relates to illumination systems that use solid-state based illumination devices providing direct and indirect illumination onto a target surface that is located in a given environment, where the indirect illumination is provided by illuminating one or more diffusive surfaces from the given environment.

BACKGROUND

Light sources are used in a variety of applications, such as providing general illumination and providing light for electronic displays (e.g., LCDs). Historically, incandescent light sources have been widely used for general illumination purposes. Incandescent light sources produce light by heating a filament wire to a high temperature until it glows. The hot filament is protected from oxidation in the air with a glass enclosure that is filled with inert gas or evacuated. Incandescent light sources are gradually being replaced in many applications by other types of electric lights, such as fluorescent lamps, compact fluorescent lamps (CFL), cold cathode fluorescent lamps (CCFL), high-intensity discharge lamps, and light-emitting diodes (LEDs).

SUMMARY

The present disclosure relates to illumination systems that use solid-state based illumination devices providing direct and indirect illumination onto a target surface that is located in a given environment. In accordance with the disclosed technologies, the solid-state based illumination devices provide the indirect illumination of the target surface by illuminating one or more diffusive surfaces from the given environment that are different from the target surface. A surface is referred to as a diffusive surface because light that impinges on the diffuse surface, in accordance with an arbitrary intensity distribution, is reflected by the diffusive surface in all directions which lie in the half-space adjacent to the surface (and obeys a Lambertian intensity distribution). For example, a solid-state based illumination device can be supported from a ceiling of a room and configured to directly illuminate a target surface of the room, e.g., the floor, a desk in the room, a side-panel of an object in the room or a side-panel on a wall of the room, and to further illuminate the ceiling and/or one or more walls of the room. In this arrangement, the light which illuminates the ceiling diffusely reflects off the ceiling and indirectly illuminates the floor. Moreover, the illumination device can be configured to directly illuminate the floor in a manner that conforms to glare standards. In general, the disclosed illumination systems can be configured to provide light for particular lighting applications, including office lighting, garage lighting, or cabinet lighting, for instance.

A variety of illumination devices are disclosed that are configured to manipulate light provided by multiple light-emitting elements (LEEs). The LEEs can include LEDs, for example solid-state LEDs. In general, implementations of the illumination devices feature one or more primary optics (e.g., parabolic, elliptical, conical optical couplers) that redirect illumination from the LEEs to secondary optics which then output the light into a range of angles. In some implementations, an illumination device includes a light guide that guides light from the primary optics to the secondary optics. The components of the illumination devices can be configured in a variety of ways so a variety of intensity distributions can be output by the illumination devices. Such illumination devices can be configured to provide light for particular lighting applications directly to the target surface from the given environment and to one or more diffusive surfaces from the given environment that are different from the target surface.

Reference numbers and designations in the various drawings indicate exemplary aspects, implementations of particular features of the present disclosure.

DETAILED DESCRIPTION

The present disclosure relates to illumination systems configured to directly and indirectly illuminate a target surface in a given environment, e.g., a floor of a room, a garage, etc., using an illumination device arranged and configured to (i) directly illuminate the target surface; and (ii) illuminate one or more diffusive surfaces from the given environment that are different from the target surface, e.g., a ceiling of the room, the garage, etc., such that the light which illuminates the diffusive surfaces reflects there-off and indirectly illuminates the target surface. In some implementations, the diffusive surfaces are positioned away from and facing the target area. For example, a diffusive surface is the ceiling of a room and the target area is the floor of (or a desk surface in) the room. The illumination device includes light emitting elements (LEEs, such as, e.g., light emitting diodes, LEDs) and redirecting optics that are configured to provide direct and indirect illumination distributions. In some implementations, the illumination device is configured to allow interdependent as well as independent control of the indirect illuminations by a user.

Figure 1A:
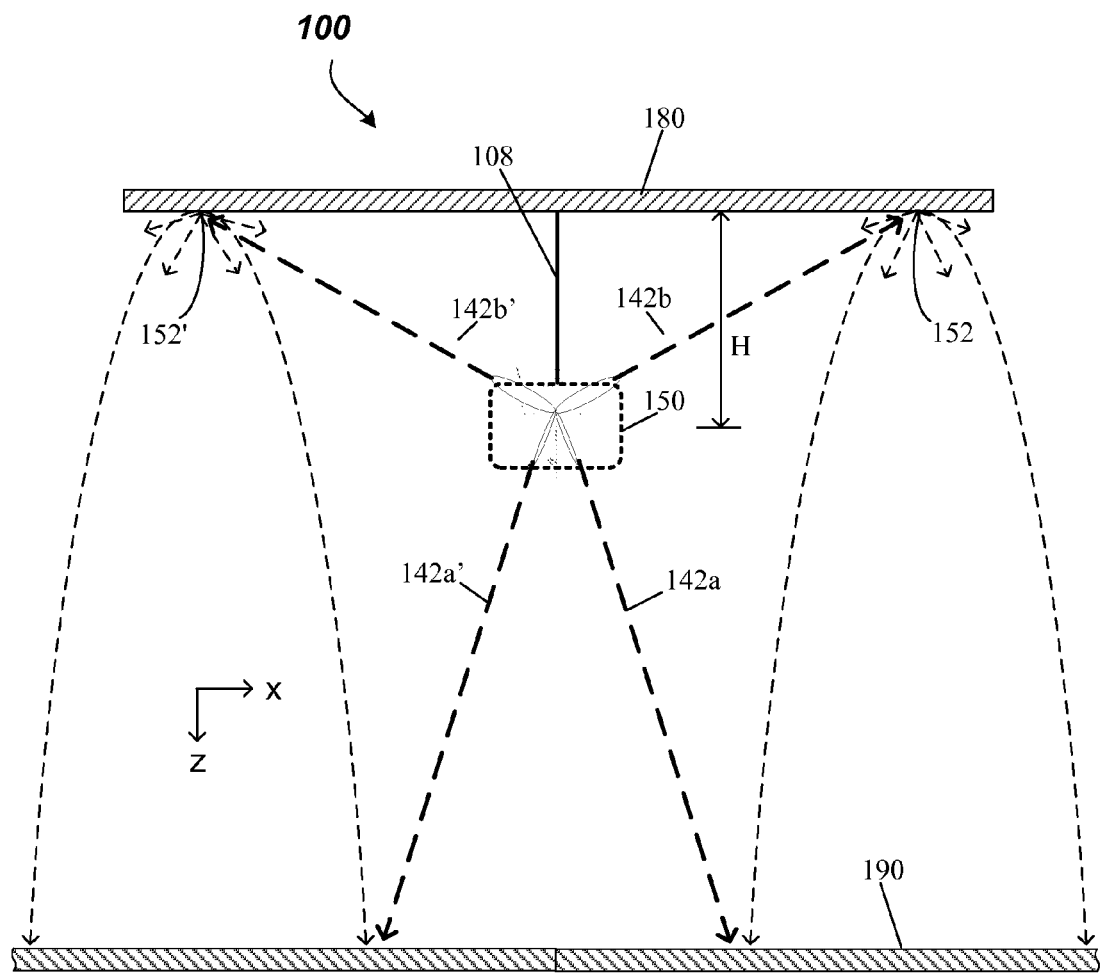
FIG. 1A shows an example of an illumination system including an illumination device that provides direct and indirect illumination.

(i) Illumination Systems Including an Illumination Device Used to Provide Direct and Indirect Illumination FIG. 1A illustrates a block diagram of an illumination system 100 in which a Cartesian coordinate system is shown for schematic reference. The illumination system 100 is configured to illuminate a target surface 190 in a given environment, e.g., the floor of a room, and includes an illumination device 150. The illumination device 150 includes light emitting elements (LEEs, such as, e.g., light emitting diodes, LEDs) configured to emit light, and redirecting optics coupled with the LEEs and configured to redirect the emitted light as output light in direct angular ranges 142a, 142a' and in indirect angular ranges 142b, 142b'. The direct illumination is provided by the illumination device 150 by illuminating the target surface 190, in accordance with the direct angular distributions 142a, 142a'. Moreover, the indirect illumination to the target surface 190 is provided by the illumination device 150 by illuminating a diffusive surface 180 of the environment (e.g., the ceiling of the room) different form the target area 190, in accordance with the indirect angular ranges 142b, 142b'. In this manner, the diffusive surface 180 redirects the light received from the illumination device 150 in the indirect angular ranges 142b, 142b', such that the target surface 190 is illuminated with redirected light, in accordance with diffuse angular ranges 152, 152'. In some implementations, the diffuse angular ranges 152, 152' of light redirected by the diffusive surface 180 correspond to Lambertian light distributions. In some cases, surface 180 may have mixed specular diffuse reflective properties. As such, in some implementations, the diffuse angular ranges 152, 152' of light redirected by the surface 180 correspond to a combination of Lambertian and specular reflected light distributions.

In some implementations, the illumination device 150 is elongated along the y-axis, perpendicular to the page. In other implementations, the illumination device 150 is non-elongated, e.g. the illumination device 150 can have rotational symmetry around an axis parallel to the z-axis. In some implementations, the illumination device 150 is configured to allow interdependent as well as independent control of the direct illumination (corresponding to angular ranges 142a, 142b) and the indirect illumination (corresponding to angular ranges 142b, 142b'), by a user. The foregoing interdependent or independent control can be implemented by particular arrangements of the redirecting optics relative to the multiple LEEs, and by selectively turning on or off (or dimming) appropriate ones of the multiple LEEs of the illumination device 150, as described below in connection with FIGS. 1B, 2B and 5B.

Although not shown in FIG. 1A, selectively turning on or off (or dimming) appropriate ones of the multiple LEEs of the illumination device 150 is implemented using switch circuitry, also known as power controller. For example, the switch circuitry includes an electrical switch. In some implementation, the switch circuitry is disposed local to the illumination device 150. In other implementations, the switch circuitry is disposed remotely from the illumination device, e.g., on a wall of a room that includes the floor 190 and the ceiling 180 or on a target surface, e.g., on a table/desk/shelf. In some implementations, the switch circuitry can include one or more current sources to selectively dim appropriate ones of the multiple LEEs of the illumination device 150. For example, dimming may be implemented using pulse width modulation, pulse code modulation, amplitude dimming, phase cut dimming or other dimming schemes.

In the example illustrated in FIG. 1A, the illumination device 150 is supported by the ceiling 180 through a support 108. In some implementations, the support 108 can be wires, rods, or combinations thereof. In some implementations, an illumination device 150 that is elongated along the y-axis is supported from the ceiling 180 by a suspension system, for example frames, air craft cables or other suspension system, attached to the ends of the illumination device 150 (as shown, e.g., in FIGS. 4B and 6B.)

The illumination system 100 can be configured to provide a particular light intensity distribution on the target surface 190, subject to given constraints. For example, the illumination system 100 is configured to uniformly illuminate the floor 190 (e.g., to obtain 10% or other overlap between each of adjacent direct angular ranges 152', 142a', 142a and 152 at the floor level), and to be in conformance with glare standards. For example, light redirected towards the floor 190 in the direct angular ranges 142a and 142a' is configured not to exceed a glancing angle of 40° with respect to the z-axis. In this manner, American National Standard Practice for Office Lighting RP-1 specifies that the amount of light emitted above 55° is smaller than 300 cd. Such configurations of the illumination system 100 can be implemented by selecting appropriate combinations of system parameters such as (i) the direct angular ranges 142a, 142a' of direct light output by the illumination device 150; (ii) the indirect angular ranges 142b, 142b' of indirect light output by the illumination device 150 relative to the angular ranges 152, 152' of the light redirected by the diffuse surface 180; and (iii) a distance "H" from the diffuse surface 180 (e.g., the ceiling) to an effective center of the illumination device 150, e.g., H=3 ft.

Figure 1B:
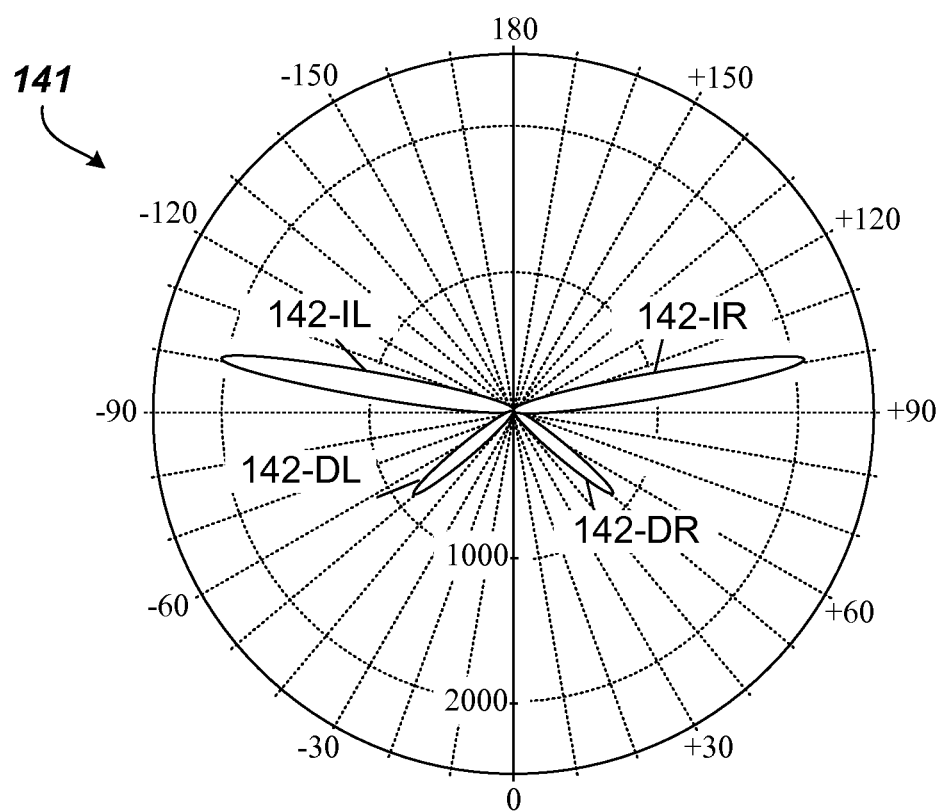
FIG. 1B shows an example of an intensity profile of an illumination device that provides direct and indirect illumination used in the illumination system of FIG. 1A.

(ii) Direct and Indirect Illumination Provided by the Illumination Device of the Illumination System FIG. 1B shows an x-z cross-section of an example light intensity profile 141 of the illumination device 150 that is elongated along the y-axis (perpendicular to the sectional plane of FIG. 1A). It is noted that FIG. 1B disregards possible different origins of different lobes 142-DL, 142-DR, 142-IL and 142-IR. Such detail is indicated in FIGS. 2B and 5B and may or may not be relevant for far field illumination, depending on the implementation.

Lobes 142-DR and 142-DL of the light intensity profile 141 respectively represent direct light output by the illumination device 150 to the right-side and left-side of the x-z cross-section of the illumination device 150 and correspond to respective direct angular ranges 142a and 142a'. Lobes 142-IR and 142-IL of the light intensity profile 141 respectively represent indirect light output by the illumination device 150 to the right-side and left-side of the x-z cross-section of the illumination device 150 and correspond to respective indirect angular ranges 142b and 142b'.

As described in detail below, composition and geometry of components of the illumination device 150 can affect the light intensity profile 141. For the example illustrated in FIG. 1B, the illumination device 150 is configured to direct substantially all of the indirect light 142-IL to the left-side of the x-z cross-section of the illumination device 150 into a range of polar angles between −90° and −120° towards the ceiling 180, and all of the indirect light 142-IR to the right-side of the x-z cross-section of the illumination device 150 into a range of polar angles between +90° and +120° towards the ceiling 180. In this case, the forward direction is the direction of the z-axis and can be toward the floor 190 for the illumination system 100. Here, the illumination device 150 is configured to direct substantially all of the forward (e.g., direct) light 142-DR, 142-DL into a range of polar angles between −60° and +60° in the x-z cross-sectional plane of the illumination device 150. According to another implementation, the illumination profile of the forward light is configured to illuminate a target surface with a particular degree of uniformity. Such an illumination profile may be referred to as a batwing profile.

In some implementations, multiple correlated color temperature (CCT) or other chromaticity light sources can be included in the illumination device 150. These multiple CCT light sources can be controlled (e.g., certain LEEs may be selectively powered on/off, dimmed, etc., during operation) to interpolate between the CCTs and intensity levels in either of lobes 142-DR, or 142-DL, or 142-IR, or 142-IL; in either of combinations of lobes 142-DR and 142-DL, or 142-IR and 142-IL; and in either of combinations of lobes 142-DR and 142-IR, or 142-DL and 142-IL or other combinations. In this manner, the CCT corresponding to the lobes or combinations of lobes can be modified from a bluish to a reddish CCT throughout the day to accomplish certain bioluminous effects, for instance.

In some configurations of the illumination device 150, certain of the LEEs of the illumination device 150 can be dimmed, or turned off during operation, such that the illumination device 150 outputs light mostly (or only) in lobes 142-DR and 142-DL to directly illuminate both right and left sides of the floor 190, with respect to the x-z cross-section of the illumination device 150. These configurations of the illumination device 150 can be implemented using an illumination device having a structure described generally in connection with FIG. 2A. An example of such an illumination device is described in detail in connection with FIGS. 4A-4B. In these configurations of the illumination device, certain other of the LEEs of the illumination device can be dimmed, or turned off during operation, such that the illumination device outputs light mostly (or only) in lobes 142-IR and 142-IL to illuminate both right and left sides of the ceiling 180, with respect to the x-z cross-section of the illumination device 150, in order to provide indirect illumination to the floor 190.

In other configurations of the illumination device 150, some of the LEEs of the illumination device 150 can be dimmed, or turned off during operation, such that the illumination device 150 outputs light mostly (or only) in lobes 142-DR and 142-IR to directly and indirectly illuminate right side of the floor 190, with respect to the x-z cross-section of the illumination device 150. These other configurations of the illumination device 150 can be implemented using an illumination device having a structure described generally in connection with FIG. 5A. An example of such an illumination device is described in detail in connection with FIGS. 6A-6B. In these other configurations of the illumination device, some other of the LEEs of the illumination device can be dimmed, or turned off during operation, such that the illumination device outputs light mostly (or only) in lobes 142-DL and 142-IL to directly and indirectly illuminate the left side of the floor 190, with respect to the x-z cross-section of the illumination device 150.

Figure 2A:
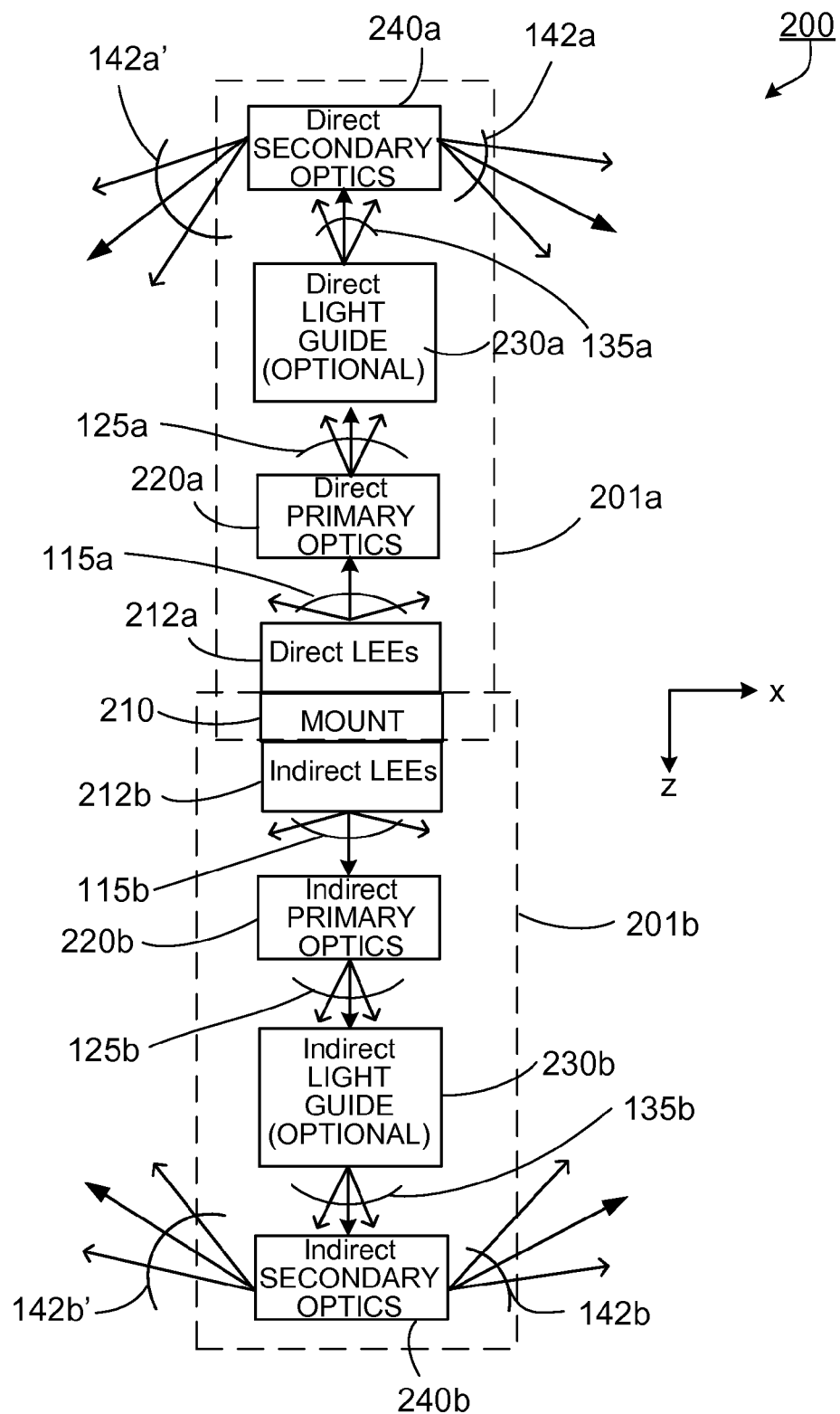
FIG. 2A shows a diagrammatic representation of an illumination device that provides direct and indirect illumination with an intensity profile as shown in FIGS. 1B and 2B.
Figure 2B:
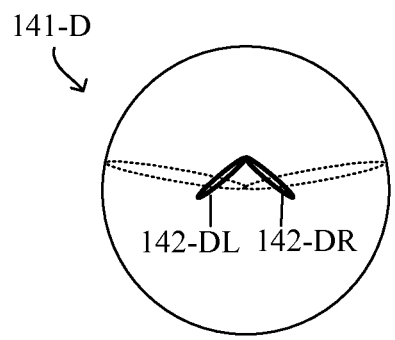
FIG. 2B shows instances of an intensity profile of the illumination device of FIG. 2A.
Figure 2B:
Figure 2B:
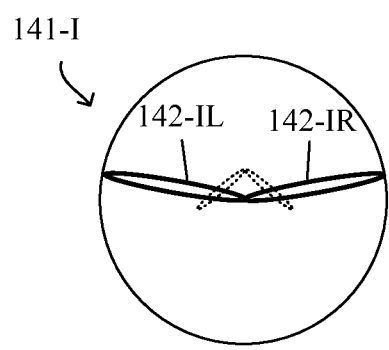

(iii) Illumination Device Used to Provide Direct and/or Indirect Illumination on Both Right and Left Sides of the Illumination Device FIG. 2A illustrates a block diagram of an illumination device 200 in which a Cartesian coordinate system is shown for schematic reference. In this example, the coordinate system is oriented relative to the illumination device 200 such that light output by the illumination device 200 in each of direct angular ranges 142a, 142a' has a prevalent direction with a non-zero component that is parallel to the z-axis, and in each of indirect angular ranges 142b, 142b' has a prevalent direction with a non-zero component that is antiparallel to the z-axis. Also in this example, the illumination device 200 can provide indirect illumination to a target surface in a given environment, when the target surface is spaced apart from the illumination device 200 in the positive direction of the z-axis. In this manner, the illumination device 200 is configured to illuminate (in addition to the target surface) a diffusive surface in the given environment, when the diffusive surface is spaced apart from the illumination device 200 in the negative direction of the z-axis.

The illumination device 200 includes a direct illumination portion 201a, an indirect illumination portion 201b and a mount 210. The direct and indirect illumination portions 201a and 201b are supported by the mount 210 such that (i) direct illumination is provided to the target by the illumination device 200 with light output by the direct illumination portion 201a in the direct angular ranges 142a, 142a'; and (ii) indirect illumination is provided to the target by the illumination device 200 with light output by the indirect illumination portion 201b in the indirect angular ranges 142b, 142b'.

According to some implementations the illumination device 200 may be configured to provide light in only one of the direct angular ranges 142a, 142a' and one of the indirect angular ranges 142b, 142b' or combinations thereof. Example combinations include {142a and 142b}, {142a' and 142b'}, {142a' and 142b}, {142a and 142b'}, {142a and 142a' and 142b}, and so forth.

An example implementation of the illumination device 200 is described below in connection with FIGS. 4A-4B. Example implementations of the direct and/or indirect illumination portions 201a, 201b are described below in connection with FIGS. 3A-3G.

(iii-a) Direct Illumination Portion of the Illumination Device

The direct illumination portion 201a includes one or more direct LEEs 212a disposed on a first surface of the mount 210, one or more direct primary optics 220a (e.g., direct optical couplers), an optional direct light guide 230a, and a direct secondary optic 240a (e.g., direct optical extractor). The direct LEEs 212a emit light, during operation, in a first direct angular range 115a with respect to their optical axes, which can coincide with a normal to the first surface of the mount 210 (e.g., antiparallel to the z-axis). For example, a divergence of the first direct angular range 115a of the light emitted by the direct LEEs 212a can be 150°-180° around optical axes of the direct LEEs 212a. This may correspond with an illumination pattern with a full width half maximum of 30°, for example. The direct primary optics 220a receive light in the first direct angular range 115a from the direct LEEs 212a. Each direct primary optic 220a is configured to redirect the light received in the first direct angular range 115a into a light with a second direct angular range 125a and direct it into a first end of direct light guide 230a. For example, a divergence of the second direct angular range 125a of the light provided by the direct primary optics 220a can be between about 40 to about 80°. When the direct light guide 230a is not part of the direct illumination portion 201a, the direct primary optics 220a redirect the light with the second direct angular range 125a towards the direct secondary optic 240a. The direct light guide 230a can guide the light to a distal end of the direct light guide 230a away from direct LEEs 212a. The direct light guide 230a provides the guided light at the distal end in a third direct angular range 135a. In some implementations, the direct light guide 230a can be shaped to guide the light received from the direct primary optics 220a in the second direct angular range 125a and to provide the guided light in substantially the same second direct angular range (direct angular range 135a≈direct angular range 125a) at the output end of the direct light guide 230a. The direct secondary optic 240a receives light with third direct angular range 135a that exits end of the direct light guide 230a or, when the direct light guide 230a is not part of the direct illumination portion 201a, the direct secondary optic 240a receives the light with second direct angular range 125a provided by the direct primary optics 220a. The direct secondary optic 240a includes a reflective interface that reflects the light, which exits direct illumination portion 201a (indicated by arrows) with one or more direct output angular ranges 142a, 142a'. The reflective interface of the direct secondary optic 240a includes two light reflecting surfaces. As described below in connection with FIGS. 3A-3G, the direct output angular ranges 142a, 142a' at which light exits the direct secondary optic 240a can depend on the properties of direct secondary optic 240a (e.g., geometry of the optical interfaces and optical properties of the materials forming the direct secondary optic 240a).

(iii-b) Indirect Illumination Portion of the Illumination Device

The indirect illumination portion 201b includes one or more indirect LEEs 212b disposed on a second surface of the mount 210, one or more indirect primary optics 220b (e.g., indirect optical couplers), an optional indirect light guide 230b, and an indirect secondary optic 240b (e.g., indirect optical extractor). The indirect LEEs 212b emit light, during operation, in a first indirect angular range 115b with respect to their optical axes, which can coincide with a normal to the second surface of the mount 210 (e.g., parallel to the z-axis). For example, a divergence of the first indirect angular range 115b of the light emitted by the indirect LEEs 212b can be 150°-180° around optical axes of the indirect LEEs 212b. This may correspond with an illumination pattern with a full width half maximum of 30°, for example. The indirect primary optics 220b receive light in the first indirect angular range 115b from the indirect LEEs 212b. Each indirect primary optic 220b is configured to redirect the light received in the first indirect angular range 115b into a light with a second indirect angular range 125b and direct it into a first end of indirect light guide 230b. For example, a divergence of the second indirect angular range 125b of the light provided by the indirect primary optics 220b can be between about 40 to about 80°. When the indirect light guide 230b is not part of the indirect illumination portion 201b, the indirect primary optics 220b redirect the light with the second indirect angular range 125b towards the indirect secondary optic 240b. The indirect light guide 230b can guide the light to a distal end of the indirect light guide 230b away from indirect LEEs 212b. The indirect light guide 230b provides the guided light at the distal end in a third indirect angular range 135b. In some implementations, the indirect light guide 230b can be shaped to guide the light received from the indirect primary optics 220b in the second indirect angular range 125b and to provide the guided light in substantially the same second indirect angular range (indirect angular range 135b≈indirect angular range 125b) at the output end of the indirect light guide 230b. The indirect secondary optic 240b receives light with third indirect angular range 135b that exits end of the indirect light guide 230b or, when the indirect light guide 230b is not part of the indirect illumination portion 201b, the indirect secondary optic 240b receives the light with second indirect angular range 125b provided by the indirect primary optics 220b. The indirect secondary optic 240b includes a reflective interface that reflects the light, which exits indirect illumination portion 201b (indicated by arrows) with one or more indirect output angular ranges 142b, 142b'. The reflective interface of the indirect secondary optic 240b includes two light reflecting surfaces. As described below in connection with FIGS. 3A-3G, the indirect output angular ranges 142b, 142b' at which light exits the indirect secondary optic 240b can depend on the properties of indirect secondary optic 240b (e.g., geometry of the optical interfaces and optical properties of the materials forming the indirect secondary optic 240b).

(iv) Direct and/or Indirect Illumination Provided on Both Right and Left Sides of the Illumination Device The illumination device 200 can be configured to allow a user to interdependently as well as independently power the direct LEEs 212a and the indirect LEEs 212b and as such correspondingly control direct and indirect illumination. For instance, the intensity profile 141 illustrated in FIG. 1B corresponds to an intensity profile output by the illumination device 200 when both the direct LEEs 212a and the indirect LEEs 212b are powered ON. Referring to FIG. 1B, lobes 142-DR and 142-DL of the light intensity profile 141 represent direct light output by the illumination device 200 to the right-side and left-side of the x-z cross-section of the illumination device 200 and correspond to respective direct angular ranges 142a and 142a'. Lobes 142-IR and 142-IL of the light intensity profile 141 represent indirect light output by the illumination device 150 to the right-side and left-side of the x-z cross-section of the illumination device 150 and correspond to respective indirect angular ranges 142b and 142b'.

FIG. 2B shows two instances of a light intensity profile of the illumination device 200. It is noted that contrary to a typical far field polar plot representation, the center of the intensity profiles for the illustrated lobes are offset to correspond with the notional origin of the direct angular ranges 142a, 142a' and the indirect angular ranges 142b, 142b' illustrated in FIG. 4A, for example. A first instance 141-D of the light intensity profile corresponds to the illumination device 200 having the direct LEEs 212a powered ON and the indirect LEEs 212b powered OFF (or dimmed with respect to the direct LEEs 212a). In this first instance, lobes 142-DR and 142-DL of the light intensity profile 141-D represent direct light output by the illumination device 200 to the right-side and left-side of the x-z cross-section of the illumination device 200 and correspond to respective direct angular ranges 142a and 142a'. A second instance 141-I of the light intensity profile corresponds to the illumination device 200 having the indirect LEEs 212b powered ON and the direct LEEs 212a powered OFF (or dimmed with respect to the indirect LEEs 212b). In this second instance, lobes 142-IR and 142-IL of the light intensity profile 141-I represent indirect light output by the illumination device 200 to the right-side and left-side of the x-z cross-section of the illumination device 200 and correspond to respective indirect angular ranges 142b and 142b'.

(v) Luminaire Module

Figure 3A:
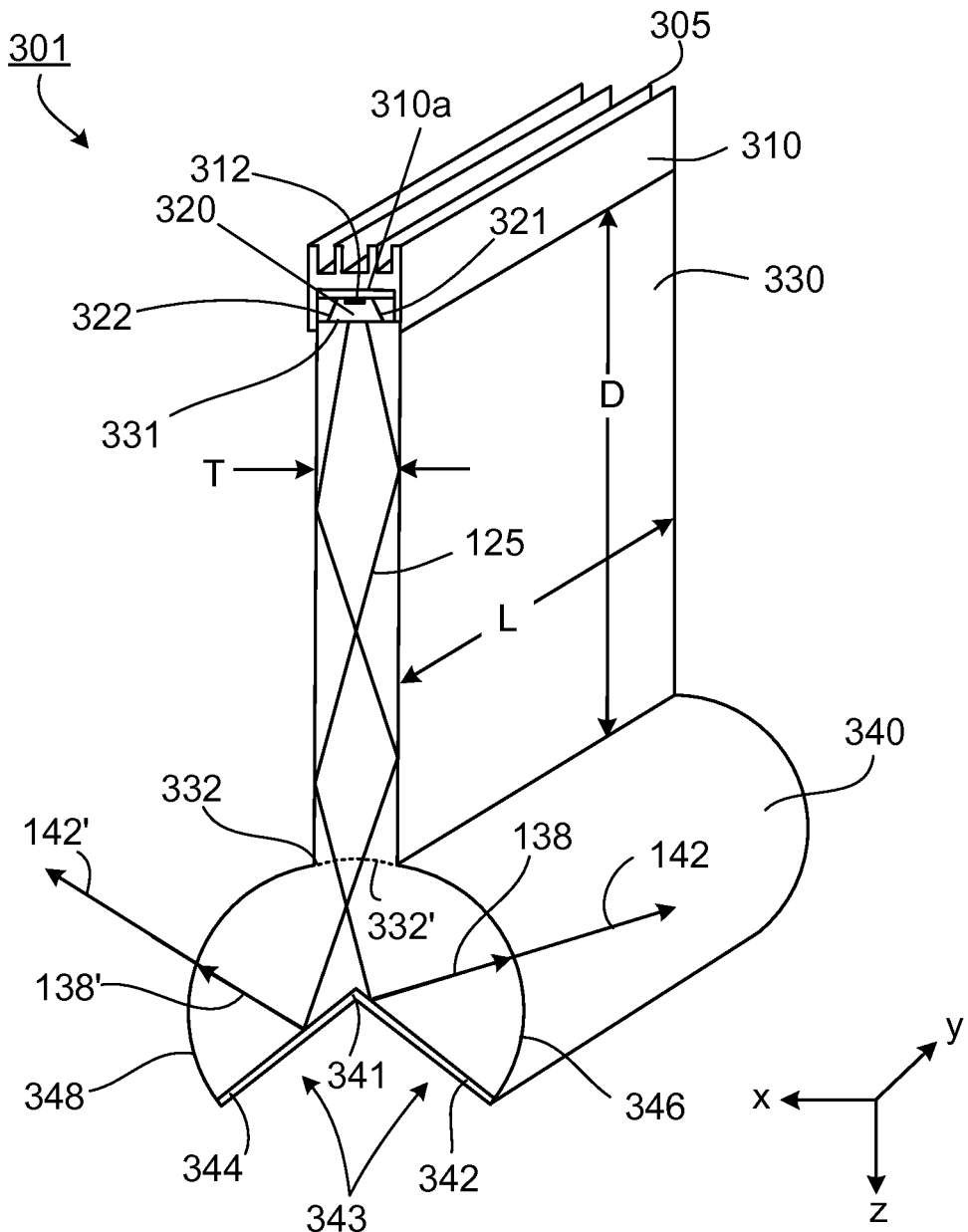
FIGS. 3A-3G show aspects of an example of a luminaire module included in the illumination devices of FIG. 2A or 5A.

FIG. 3A shows an example of a luminaire module 301 that can be used to implement the direct illumination portion 201a, or the indirect illumination portion 201b, or both direct and indirect illumination portions 201a, 201b of an elongate implementation of illumination device 200.

A Cartesian coordinate system is shown in FIG. 3A for reference. The luminaire module 301 includes a mount 310 having a plurality of direct or indirect LEEs 312 distributed along a first surface 310a of the mount. The mount 310 with the LEEs 312 is disposed at a first (e.g., upper) edge 331 of a light guide 330. As shorthand, the positive z-direction is referred to herein as the "forward" direction and the negative z-direction is the "backward" direction. Sections through the illumination device parallel to the x-z plane are referred to as the "cross-section" or "cross-sectional plane" of the luminaire module. Also, luminaire module 301 extends along the y-direction, so this direction is referred to as the "longitudinal" direction of the luminaire module. Lastly, implementations of luminaire modules can have a plane of symmetry parallel to the y-z plane. This is referred to as the "symmetry plane" of the luminaire module.

Multiple LEEs 312 are disposed on the first surface 310a of the mount, although only one of the multiple LEEs 312 is shown in FIG. 3A. For example, the plurality of LEEs 312 can include multiple white LEDs. An optical extractor 340 is disposed at second (e.g., lower) edge 332 of light guide 330. The LEEs 312 are coupled with one or more optical couplers 320 (only one of which is shown in FIG. 3A).

Mount 310, light guide 330, and optical extractor 340 extend a length L along the y-direction, so that the luminaire module is an elongated luminaire module with an elongation of L that may be about parallel to a wall of a room (e.g., a ceiling of the room). Generally, L can vary as desired. Typically, L is in a range from about 1 cm to about 300 cm (e.g., 20 cm or more, 30 cm or more, 40 cm or more, 50 cm or more, 60 cm or more, 70 cm or more, 80 cm or more, 100 cm or more, 125 cm or more, or, 150 cm or more).

The number of LEEs 312 on the mount 310 will generally depend, inter alia, on the length L, where more LEEs are used for longer luminaire modules. In some implementations, the plurality of LEEs 312 can include between 10 and 1,000 LEEs (e.g., about 50 LEEs, about 100 LEEs, about 300 LEEs, about 500 LEEs). Generally, the density of LEEs (e.g., number of LEEs per unit length) will also depend on the nominal power of the LEEs and illuminance desired from the luminaire module. For example, a relatively high density of LEEs can be used in applications where high illuminance is desired or where low power LEEs are used. In some implementations, the luminaire module 301 has an LEE density along its length of 0.1 LEE per centimeter or more (e.g., 0.2 per centimeter or more, 0.5 per centimeter or more, 1 per centimeter or more, 2 per centimeter or more). In implementations, LEEs can be evenly spaced along the length, L, of the luminaire module. In some implementations, a heat-sink 305 can be attached to the mount 310 to extract heat emitted by the plurality of LEEs 312. The heat-sink 305 can be disposed on a surface of the mount 310 opposing the side 310a of the mount 310 on which the LEEs 312 are disposed.

Optical coupler 320 includes one or more solid pieces of transparent optical material (e.g., a glass material or a transparent organic plastic, such as polycarbonate or acrylic) having surfaces 321 and 322 positioned to reflect light from the LEEs 312 towards the light guide 330. In general, surfaces 321 and 322 are shaped to collect and at least partially collimate light emitted from the LEEs. In the x-z cross-sectional plane, surfaces 321 and 322 can be straight or curved. Examples of curved surfaces include surfaces having a constant radius of curvature, parabolic or hyperbolic shapes. In some implementations, surfaces 321 and 322 are coated with a highly reflective material (e.g., a reflective metal, such as aluminum or silver), to provide a highly reflective optical interface. The cross-sectional profile of optical coupler 320 can be uniform along the length L of luminaire module 301. Alternatively, the cross-sectional profile can vary. For example, surfaces 321 and/or 322 can be curved out of the x-z plane.

The surface of optical coupler 320 adjacent upper edge of light guide 331 is optically coupled to edge 331. In other words, the surfaces of the interface are attached using a material that substantially matches the refractive index of the material forming the optical coupler 320 or light guide 330 or both. For example, optical coupler 320 can be affixed to light guide 330 using an index matching fluid, grease, or adhesive. In some implementations, optical coupler 320 is fused to light guide 330 or they are integrally formed from a single piece of material (e.g., coupler and light guide may be monolithic and may be made of a solid transparent optical material).

Light guide 330 is formed from a piece of transparent material (e.g., glass material such as BK7, fused silica or quartz glass, or a transparent organic plastic, such as polycarbonate or acrylic) that can be the same or different from the material forming optical couplers 320. Light guide 330 extends length L in the y-direction, has a uniform thickness T in the x-direction, and a uniform depth D in the z-direction. The dimensions D and T are generally selected based on the desired optical properties of the light guide and/or the direct/indirect intensity distribution. During operation, light coupled into the light guide 330 from optical coupler 320 (depicted by rays 125) reflects off the planar surfaces of the light guide by TIR and spatially mixes within the light guide. The mixing can help achieve illuminance and/or color uniformity at the distal portion of the light guide 332 at optical extractor 340. The depth, D, of light guide 330 can be selected to achieve adequate uniformity at the exit aperture (i.e., at end 332) of the light guide. In some implementations, D is in a range from about 1 cm to about 20 cm (e.g., 2 cm or more, 4 cm or more, 6 cm or more, 8 cm or more, 10 cm or more, 12 cm or more).

In general, optical couplers 320 are designed to restrict the angular range of light entering the light guide 330 (e.g., to within +/−40 degrees) so that at least a substantial amount of the light is coupled into spatial modes in the light guide 330 that undergoes TIR at the planar surfaces. Light guide 330 has a uniform thickness T, which is the distance separating two planar opposing surfaces of the light guide. Generally, T is sufficiently large so the light guide has an aperture at first (e.g., upper) surface 331 sufficiently large to approximately match (or exceed) the aperture of optical coupler 320. In some implementations, T is in a range from about 0.05 cm to about 2 cm (e.g., about 0.1 cm or more, about 0.2 cm or more, about 0.5 cm or more, about 0.8 cm or more, about 1 cm or more, about 1.5 cm or more). Depending on the implementation, the narrower the light guide the better it may spatially mix light. A narrow light guide also provides a narrow exit aperture. As such light emitted from the light guide can be considered to resemble the light emitted from a one-dimensional linear light source, also referred to as an elongate virtual filament.

As discussed previously, length L corresponds to the length of the elongated luminaire module and can vary as desired.

While optical coupler 320 and light guide 330 are formed from solid pieces of transparent optical material, hollow structures are also possible. For example, the optical coupler 320 or the light guide 330 or both may be hollow with reflective inner surfaces rather than being solid. As such material cost can be reduced and absorption in the light guide avoided. A number of specular reflective materials may be suitable for this purpose including materials such as 3M Vikuiti™ or Miro IV™ sheet from Alanod Corporation where greater than 90% of the incident light would be efficiently guided to the optical extractor. Optical extractor 340 is also composed of a solid piece of transparent optical material (e.g., a glass material or a transparent organic plastic, such as polycarbonate or acrylic) that can be the same as or different from the material forming light guide 330. In the example implementation shown in FIG. 3A, the piece of dielectric material includes redirecting (e.g., flat) surfaces 342 and 344 and curved output surfaces 346 and 348 (also referred to as exit surfaces). The redirecting surfaces 342 and 344 represent first and second portions of a redirecting surface 343, while the curved output surfaces 346 and 348 represent first and second output surfaces of the luminaire module 301.

Redirecting surfaces 342 and 344 are coated with a highly reflective material (e.g., a highly reflective metal, such as aluminum or silver) over which a protective coating may be disposed. Thus, redirecting surfaces 342 and 344 provide a highly reflective optical interface for light entering an input end of the optical extractor 332' from light guide 330. In the x-z cross-sectional plane, the lines corresponding to redirecting surfaces 342 and 344 have the same length and form an apex or vertex 341, e.g. a v-shape that meets at the apex 341. In general, an included angle (e.g., the smallest included angle between the redirecting surfaces 344 and 342) of the redirecting surfaces 342, 344 can vary as desired. For example, in some implementations, the included angle can be relatively small (e.g., from 30° to 60°). In certain implementations, the included angle is in a range from 60° to 120° (e.g., about 90°). The included angle can also be relatively large (e.g., in a range from 120° to 150° or more). In the example implementation shown in FIG. 3A, the output surfaces 346 and 348 of the optical extractor 340 are curved with a constant radius of curvature that is the same for both. In an aspect, the output surfaces 346, 348 may include optical power. Accordingly, luminaire module 301 has a plane of symmetry intersecting apex 341 parallel to the y-z plane.

The surface of optical extractor 340 adjacent to the lower edge 332 of light guide 330 is optically coupled to edge 332. For example, optical extractor 340 can be affixed to light guide 330 using an index matching fluid, grease, or adhesive. In some implementations, optical extractor 340 is fused to light guide 330 or they are integrally formed from a single piece of material.

The emission spectrum of the luminaire module 301 corresponds to the emission spectrum of the LEEs 312. However, in some implementations, a wavelength-conversion material may be positioned in the luminaire module, for example remote from the LEEs, so that the wavelength spectrum of the luminaire module is dependent both on the emission spectrum of the LEEs and the composition of the wavelength-conversion material. In general, a wavelength-conversion material can be placed in a variety of different locations in luminaire module 301. For example, a wavelength-conversion material may be disposed proximate the LEEs 312, adjacent redirecting surfaces 342 and 344 of optical extractor 340, on the exit surfaces 346 and 348 of optical extractor 340, placed at a distance from the exit surfaces 346 and 348 and/or at other locations.

The layer of wavelength-conversion material may be attached to light guide 330 held in place via a suitable support structure (not illustrated), disposed within the extractor (also not illustrated) or otherwise arranged, for example. Wavelength-conversion material that is disposed within the extractor may be configured as a shell or other object and disposed within a notional area that is circumscribed by R/n or even smaller $R*(1+n^2)^{(-1/2)}$, where R is the radius of curvature of the light-exit surfaces (346 and 348 in FIG. 3A) of the extractor and n is the index of refraction of the portion of the extractor that is opposite of the wavelength-conversion material as viewed from the redirecting surfaces (342 and 344 in FIG. 3A). The support structure may be transparent self-supporting structure. The light-converting material diffuses light as it converts the wavelengths, provides mixing of the light and can help uniformly illuminate target surfaces disposed within the output angular ranges 142, 142'.

During operation, light exiting light guide 330 through end 332 impinges on the reflective interfaces at portions of the redirecting surface 342 and 344 and is reflected outwardly towards output surfaces 346 and 348, respectively, away from the symmetry plane of the luminaire module. The first portion of the redirecting surface 342 provides light having an angular distribution 138 towards the output surface 346, the second portion of the redirecting surface 344 provides light having an angular distribution 138' towards the output surface 346. The light exits optical extractor through output surfaces 346 and 348. In general, the output surfaces 346 and 348 have optical power, to redirect the light exiting the optical extractor 340 in angular ranges 142 and 142', respectively. For example, optical extractor 340 may be configured to emit light upwards (i.e., towards the plane intersecting the LEEs and parallel to the x-y plane), downwards (i.e., away from that plane) or both upwards and downwards. In general, the direction of light exiting the luminaire module through output surfaces 346 and 348 depends on the divergence of the light exiting light guide 330 and the orientation of redirecting surfaces 342 and 344.

Redirecting surfaces 342 and 344 may be oriented so that little or no light from light guide 330 is output by optical extractor 340 in directions that are within a certain angle of the forward direction (i.e., in certain angular ranges relative to the positive z-direction). In implementations where the luminaire module 301 is attached to a ceiling of a room so that the forward direction is towards the floor, such configurations can help avoid glare and an appearance of non-uniform illuminance.

In general, the light intensity distribution provided by luminaire module 301 reflects the symmetry of the luminaire module's structure about the y-z plane.

In general, the intensity profile of luminaire module 301 will depend on the configuration of the optical coupler 320, the light guide 330 and the optical extractor 340. For instance, the interplay between the shape of the optical coupler 320, the shape of the redirecting surface 343 of the optical extractor 340 and the shapes of the output surfaces 346, 348 of the optical extractor 340 can be used to control the angular width and prevalent direction (orientation) of the lobes in the intensity profile 141.

In some implementations, the orientation of the lobes 142-DR, 142-DL, 142-IR, 142-IL can be adjusted based on the included angle of the v-shaped groove 341 formed by the portions of the redirecting surface 342 and 344. For example, a first included angle results in an intensity distribution 141 with lobes 142-DR, 142-DL (or 142-IR, 142-IL) located at relatively smaller angles compared to lobes 142-DR, 142-DL (or 142-IR, 142-IL) of the intensity distribution 141 that results for a second included angle larger than the first angle. In this manner, light can be extracted from the luminaire module 301 in a more forward direction for the smaller of two included angles formed by the portions of the redirecting surface 342, 344.

Furthermore, while redirecting surfaces 342 and 344 are depicted as planar surfaces, other shapes are also possible. For example, these surfaces can be curved or faceted. Curved redirecting surfaces 342 and 344 can be used to narrow or widen the beam. Depending of the divergence of the angular range of the light that is received at the input end of the optical extractor 332', concave redirecting surfaces 342, 344 can narrow the lobes 142-DR, 142-DL (or 142-IR, 142-IL) output by the optical extractor 340 (and illustrated in FIG. 2B), while convex redirecting surfaces 342, 344 can widen the lobes 142-DR, 142-DL (or 142-IR, 142-IL) output by the optical extractor 340. As such, suitably configured redirecting surfaces 342, 344 may introduce convergence or divergence into the light. Such surfaces can have a constant radius of curvature, can be parabolic, hyperbolic, or have some other curvature.

Luminaire module 301 as described in context of FIG. 3A may be used in the illumination devices described below in connection with FIGS. 4A-4B and 6A-6B.

Figure 3B:
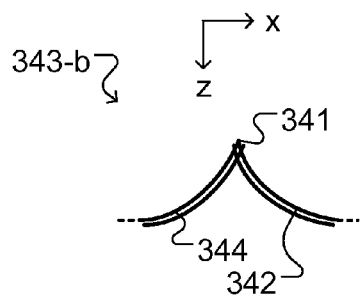
Figure 3C:
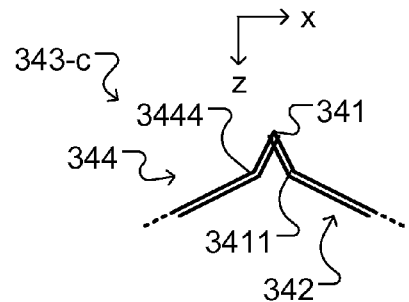
Figure 3D:
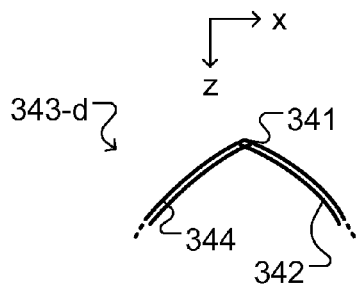

FIGS. 3B and 3D show that for a cross-sectional plane substantially perpendicular to the longitudinal dimension of the luminaire module 301, the 343 redirecting surface as described in this specification (see FIG. 3A) can have an apex 341 that may separate the first and second portions of the redirecting surface 342, 344. It should be noted that the apex 341 of the redirecting surface can be a rounded vertex with a non-zero radius of curvature. In the example implementations shown in FIGS. 3B and 3D, the first and second portions of the redirecting surface 342, 344 can have first and second arcuate shapes in the cross-sectional plane substantially perpendicular to the longitudinal dimension of the luminaire module 301. For example, the first and second portions of the redirecting surface 342, 344 can be parabolic, hyperbolic, or can have constant curvatures different from each other. Moreover, curvatures of the first and second portions of the redirecting surface 342, 344 can be both negative (e.g., convex with respect to a direction of propagation of light from the input end of the extractor to the redirecting surface 343), can be both positive (e.g., concave with respect to the propagation direction), or one can be positive (convex) and the other one can be negative (concave).

Figure 3E:
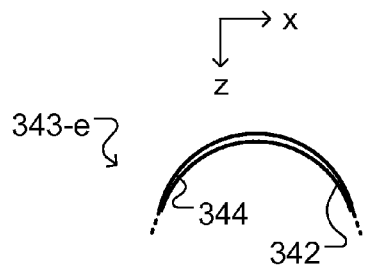

FIG. 3E shows that, for a cross-sectional plane substantially perpendicular to the longitudinal dimension of the luminaire module 301, the redirecting surface 343 can be shaped as an arc of a circle, ellipse, parabola or other curve. In this case, the first and second portions of the redirecting surface 342, 344 represent first and second portions of the arc of the circle. In the example implementation illustrated in FIG. 3E, a curvature of the redirecting surface 343 is negative (e.g., convex with respect to a direction of propagation of light from the input end of the extractor to the redirecting surface 343).

FIG. 3C shows that, for a cross-sectional plane substantially perpendicular to the longitudinal dimension of the luminaire module 301, either of the first and second portions of the redirecting surface 342, 344 can have one or more apexes, in addition to the apex 341 that separates the redirecting surface 342, 344. For example, the first portion of the redirecting surface 342 can have an apex 3411 that separates the first portion of the redirecting surface 342 in at least two regions thereof. The regions of the first portion of the redirecting surface 342 separated by the apex 3411 can have linear or arcuate shapes. The two regions of the first portion of the redirecting surface 342 can reflect the light received from the input end of the extractor 332' in two different angular sub-ranges, different from each other. In this manner, light provided by the first portion of the redirecting surface 342 is output at the output surface 346 as two intensity lobes that can be manipulated differently, e.g., to illuminate different targets. As another example, the second portion of the redirecting surface 344 can have an apex 3444 that separates the second portion of the redirecting surface 344 in at least two regions thereof.

Figure 3F:
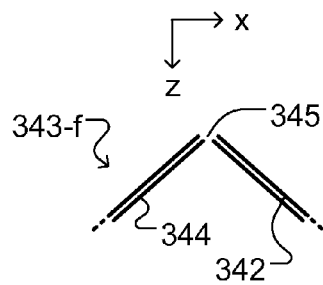
Figure 3G:
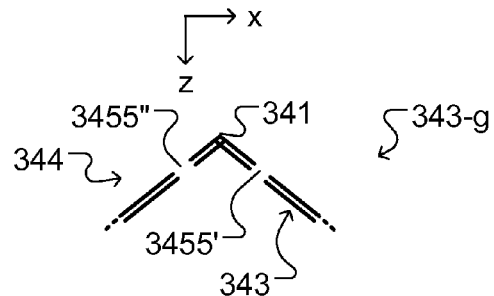

FIG. 3F shows that, in some implementations, the first and second portions of the redirecting surface 342, 344 can be separated, at least in part, by a slot 345, in general a suitably formed aperture. FIG. 3G shows that, in some implementations, either the first and second portions of the redirecting surface 342, 344 can include one or more slots 3455', 3455". Each of the slots 345, 3455', 3455" may but does not need to extend along the entire longitudinal extension of the luminaire module 301. Such a slot can represent an opening in a coating providing a reflecting layer of the redirecting surface 343 and is configured to allow a portion of light received from the input end of the extractor to transmit through the slot 345 of the redirecting surface 343. FIG. 3F shows that, for a cross-sectional plane substantially perpendicular to the longitudinal dimension of the luminaire module 301 which intersects the slot 345, first and second curves corresponding to the first and second portions of the redirecting surface 342, 344 are separated by a discontinuity. Moreover, FIG. 3G shows that, for a cross-sectional plane substantially perpendicular to the longitudinal dimension the luminaire module 301 which intersects the slots 3455', 3455", first and second curves corresponding to the first and second portions of the redirecting surface 342, 344 include one or more discontinuities associated with the slots 3455', 3455".

In addition, the curves corresponding to each of the cross-sectional planes illustrated in FIGS. 3B-3G can have different shapes and different discontinuities in other cross-sectional planes along the longitudinal dimension of the luminaire module 301. In general, different cross-sections of a redirecting surface 343 can have different combinations of disjoint or joined piecewise differentiable curves.

Moreover, the shape of output surfaces 346 and 348 of the optical extractor 340 can vary too, and thus, the output surfaces 346 and 348 can steer and shape the beam of light. For example, the radius of curvature of these surfaces can be selected so that the surfaces introduce a desired amount of convergence into the light. Aspheric surfaces can also be used. Similar properties noted above in connection with FIGS. 3B-3G regarding contours of the redirecting surface 343 of the extractor 340 in cross-sectional planes substantially perpendicular to the longitudinal dimension of the luminaire module 301 apply to contours of the output surfaces 346, 348 of the extractor 340 in such cross-sectional planes.

In general, the choices of apexes described in FIGS. 3B-3G may provide an additional degree of freedom for modifying the (direct or indirect or both) intensity distribution (e.g., illumination pattern) of the light output by the illumination devices 400 and 600. In general, the luminaire module 301 may be iteratively modified (in spatial shape of reflective surfaces, index of refraction of solid material, spectrum of emitted or guided light etc.) to provide a predetermined output illumination distribution.

In general, the geometry of the elements can be established using a variety of methods. For example, the geometry can be established empirically. Alternatively, or additionally, the geometry can be established using optical simulation software, such as Lighttools™, Tracepro™, FRED™ or Zemax™, for example.

In general, luminaire modules can include other features useful for tailoring the intensity profile. For example, in some implementations, luminaire modules can include an optically diffuse material that scatters light, thereby homogenizing the luminaire module's intensity profile. For example, redirecting surfaces 342 and 344 can be roughed or a diffusely reflecting material, rather than a specular reflective material, can be coated on these surfaces. Accordingly, the optical interfaces at redirecting surfaces 342 and 344 can diffusely reflect light, scattering light into broader lobes that would be provided by similar structures utilizing specular reflection at these interfaces. In some implementations these surfaces can include structure that facilitates various intensity distribution. For example, redirecting surfaces 342 and 344 can each have multiple planar facets at differing orientations. Accordingly, each facet will reflect light into different directions. In some implementations, redirecting surfaces 342 and 344 can have structure thereon (e.g., structural features that scatter or diffract light).

In certain implementations, a light scattering material can be disposed on output surfaces 346 and 348 of optical extractor 340. Alternatively, or additionally, output surfaces 346 and 348 need not be surfaces having a constant radius of curvature. For example, output surfaces 346 and 348 can include portions having differing curvature and/or can have structure thereon (e.g., structural features that scatter or diffract light).

Figure 4A:
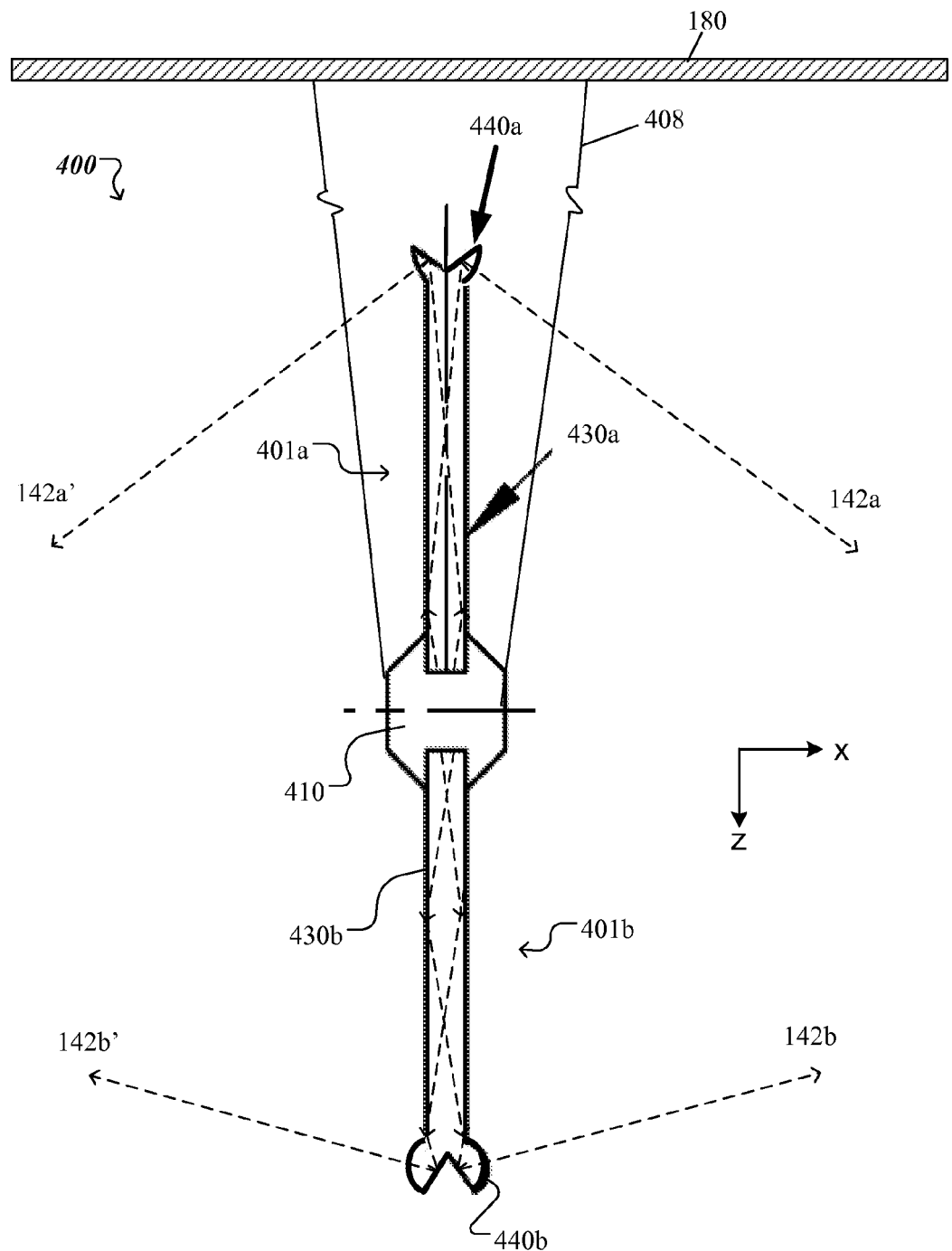
FIGS. 4A-4B show aspects of an implementation of the illumination device shown in FIG. 2A.
Figure 4B:
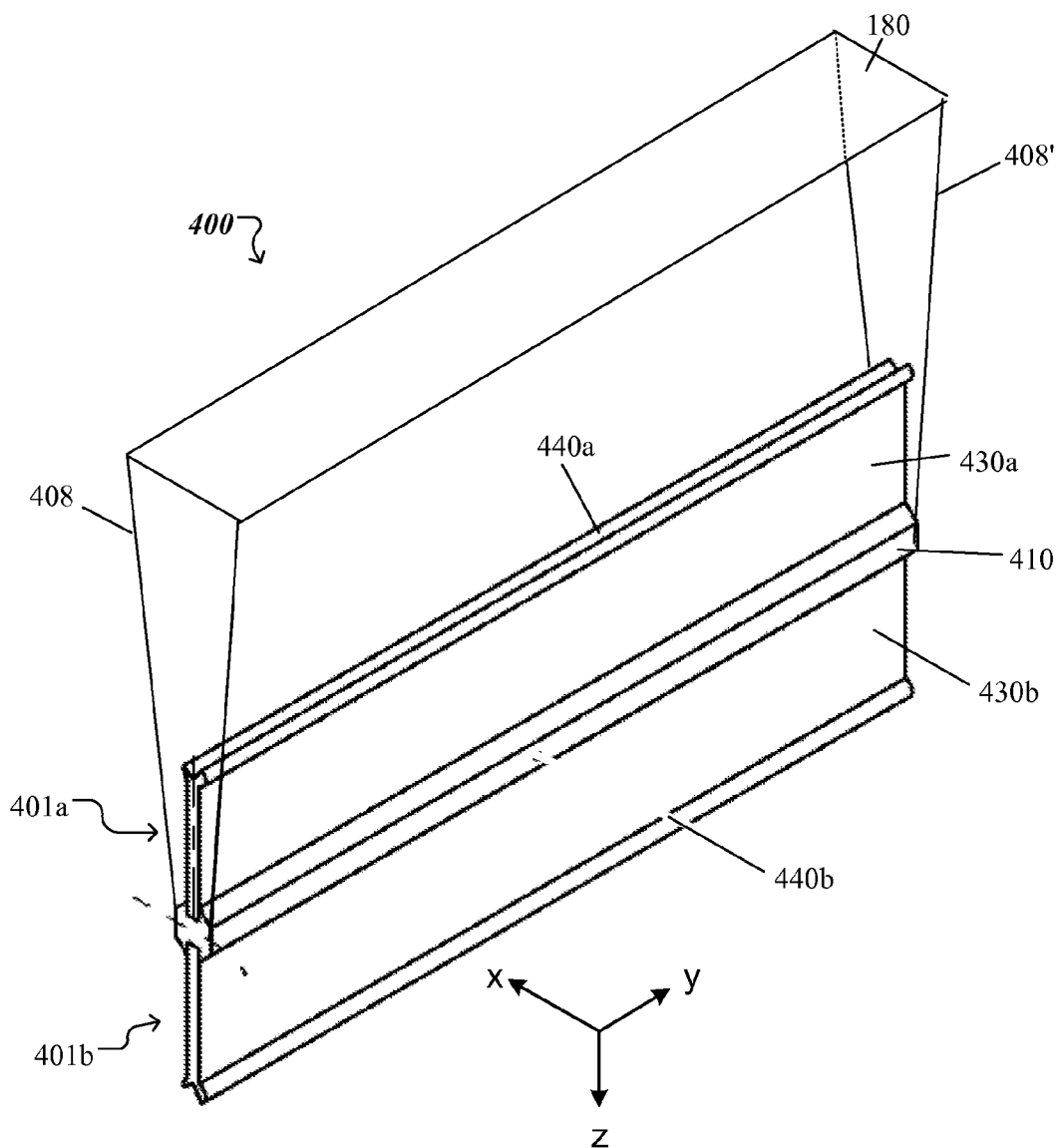

(vi) Example of an Illumination Device Used to Provide Direct and/or Indirect Illumination FIGS. 4A and 4B illustrate a sectional view and a perspective view, respectively, of an illumination device 400 used to provide direct and/or indirect illumination on both right and left sides of the illumination device 400. In this example, the illumination device 400 is supported by a ceiling 180 through support suspension system 408, 408'. The coordinate system is oriented relative to the illumination device 400 such that light output by the illumination device 400 in each of direct angular ranges 142a, 142a' has a prevalent propagation direction with a non-zero component that is parallel to the z-axis, and in each of indirect angular ranges 142b, 142b' has a prevalent propagation direction with a non-zero component that is antiparallel to the z-axis. The illumination device 400 provides direct and indirect illumination to a target surface (not illustrated in FIGS. 4A, 4B), which is spaced apart from the illumination device 400 in the positive direction of the z-axis.

The illumination device 400 includes a mount 410 that is elongated along the y-axis and supports a direct portion 401a and an indirect portion 401b of the illumination device 400. Here, the direct portion 401a of the illumination device 400 is referred to as a direct luminaire module 401a, and the indirect portion 401b of the illumination device 400 is referred to as an indirect luminaire module 401b. Both direct and indirect luminaire modules 401a and 401b are elongated along the y-axis and can be equivalent to or similar with the luminaire module 301 described above in connection with FIG. 3A. The direct and indirect luminaire modules 401a and 401b are supported by the mount 410 such that (i) elongations of the direct and indirect luminaire modules 401a and 401b are along the elongation of the mount 410 (in this example along the y-axis); (ii) direct illumination is provided to the target by the illumination device 400 with light output by the direct luminaire module 401a in the direct angular ranges 142a, 142a'; and (iii) indirect illumination is provided to the target by the illumination device 400 with light output by the indirect luminaire module 401b in the indirect angular ranges 142b, 142b'.

In this example, the direct luminaire module 401a includes direct LEEs and direct primary optics arranged inside the mount 410 (and not shown in FIGS. 4A-4B.) Additionally, the direct luminaire module 401a includes a direct light guide 430a and a direct secondary optic 440a. The direct light guide 430a is configured to guide light, emitted by the direct LEEs, from the direct primary optics to the direct secondary optic 440a. In some implementations, the portions of the redirecting surface and the output surfaces of the direct secondary optic 440a are symmetric in an x-z cross-section (as shown in FIGS. 3A-3G, for instance). In this case, the illumination device 400 outputs light in direct angular ranges 142a and 142a' that are symmetric with respect to a plane parallel to the y-z plane. In other implementations (not shown in FIGS. 4A-4B), the portions of the redirecting surface and the output surfaces of the direct secondary optic 440a can be asymmetric in the x-z cross-section. In this case, the illumination device 400 outputs light in direct angular ranges 142a and 142a' that are asymmetric with respect to a plane parallel to the y-z plane. In some asymmetric implementations, the illumination device may be configured to output light only on one side of the y-z plane.

Further in this example, the indirect luminaire module 401b includes indirect LEEs and indirect primary optics arranged inside the mount 410 (and not shown in FIGS. 4A-4B.) Additionally, the indirect luminaire module 401b includes an indirect light guide 430b and an indirect secondary optic 440b. The indirect light guide 430b is configured to guide light, emitted by the indirect LEEs, from the indirect primary optics to the indirect secondary optic 440b. In some implementations, the portions of the redirecting surface and the output surfaces of the indirect secondary optic 440b are symmetric in an x-z cross-section (as shown in FIGS. 3A-3G, for instance). In this case, the illumination device 400 outputs light in indirect angular ranges 142b and 142b' that are symmetric with respect to a plane parallel to the y-z plane. In other implementations (not shown in FIGS. 4A-4B), the portions of the redirecting surface and the output surfaces of the indirect secondary optic 440b can be asymmetric in the x-z cross-section. In this case, the illumination device 400 outputs light in indirect angular ranges 142b and 142b' that are asymmetric with respect to a plane parallel to the y-z plane.

In some implementations, the mount 410 supports the direct and indirect luminaire modules 401a, 401b to align side faces of the respective direct and indirect light guides 430a, 430b with each other along a plane parallel with the y-z plane.

In some implementations, the mount 410 can be formed of extruded aluminum. In some implementations, a width of an x-z cross-section of the mount 410 is larger than the x-z cross-section of the direct and indirect light guides 430a, 430b. In such a case, the direct and indirect LEEs can be disposed on two opposite sides of a substrate elongated along the y-axis and parallel to the x-y plane, and a heat-sink system can be offset along the x-axis with respect to a y-z plane that includes optical axes of the direct and indirect LEEs. In other implementations, a width of an x-z cross-section of the mount 410 is substantially equal to the x-z cross-section of the direct and indirect light guides 430a, 430b, as shown in FIG. 3A, for instance. In such a case, the direct and indirect LEEs can be disposed on two substrates elongated along the y-axis, parallel to the x-y plane, and separated along the z-axis by a space which accommodates a heat-sink system. In either of the foregoing implementations, the direct and indirect LEEs can be powered to emit light interdependently (e.g., concurrently) or independently (e.g., successively) from each other, as described in detail with respect to FIGS. 1B and 2B.

Figure 5A:
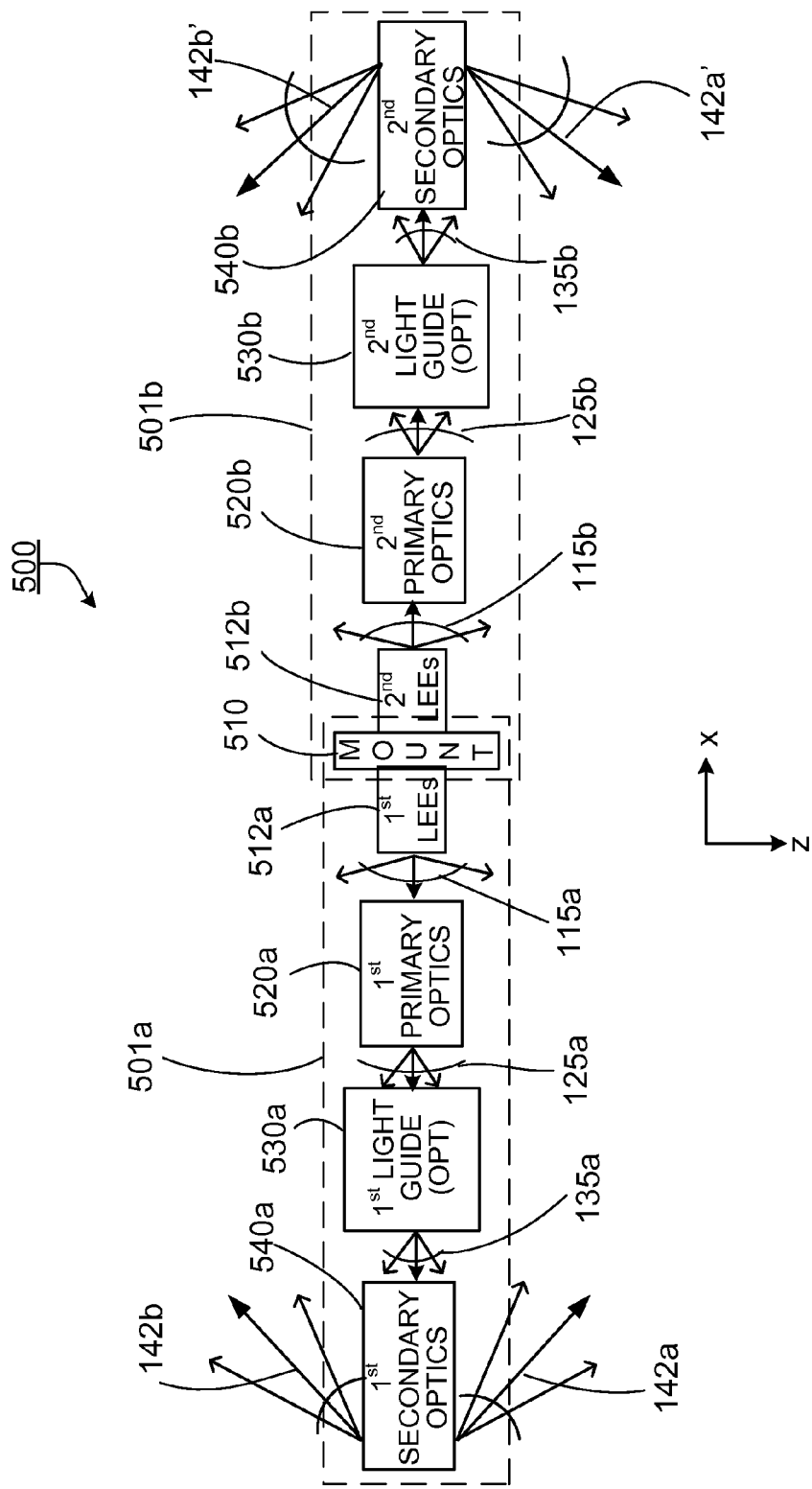
FIG. 5A shows a diagrammatic representation of an illumination device that provides direct and indirect illumination with an intensity profile as shown in FIGS. 1B and 5B.
Figure 5B:
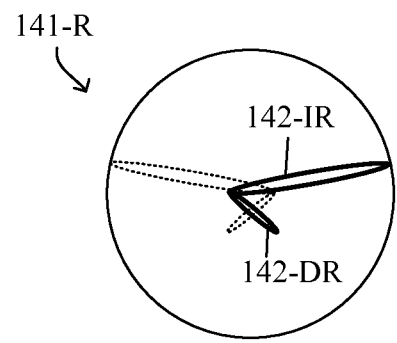
FIG. 5B shows instances of an intensity profile of the illumination device of FIG. 5A.
Figure 5B:
Figure 5B:
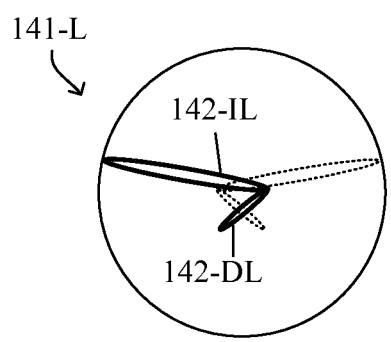

(vii) Illumination Device Used to Provide Direct and/or Indirect Illumination on Right and/or Left Sides of the Illumination Device FIG. 5A illustrates a block diagram of an illumination device 500 in which a Cartesian coordinate system is shown for schematic reference. In this example, the coordinate system is oriented relative to the illumination device 500 such that the illumination device 500 can provide on right and/or left sides thereof direct, indirect or both direct and indirect illumination to a target surface in a given environment, when the target surface is spaced apart from the illumination device 500 in the positive direction of the z-axis. In this manner, the illumination device 500 is configured to illuminate (in addition to the target surface) a diffusive surface in the given environment, when the diffusive surface is spaced apart from the illumination device 500 in the negative direction of the z-axis. In this orientation, light output by the illumination device 500 in each of a direct angular range 142a and an indirect angular range 142b has a rightward prevalent propagation direction with a non-zero component that is parallel to the x-axis, and in each of a direct angular range 142a' and an indirect angular range 142b' has a leftward prevalent propagation direction with a non-zero component that is antiparallel to the x-axis. Hence, the direct angular range 142a is referred to as the rightward direct angular range 142a and the indirect angular range 142b is referred to as the rightward indirect angular range 142b, while the direct angular range 142a' is referred to as the leftward direct angular range 142a' and the indirect angular range 142b' is referred to as the rightward indirect angular range 142b'.

The illumination device 500 includes a first illumination portion 501a arranged and configured to output light in the rightward direct angular range 142a and in the rightward indirect angular range 142b; a second illumination portion 501b arranged and configured to output light in the leftward direct angular range 142a' and in the leftward indirect angular range 142b'; and a mount 510. The first and second illumination portions 501a and 501b are supported by the mount 510 such that (i) direct illumination is provided to the target by the illumination device 500 with light output by the first illumination portion 501a in the rightward direct angular range 142a and by the second illumination portion 501b in the leftward direct angular range 142a'; and (ii) indirect illumination is provided to the target by the illumination device 500 with light output by the first illumination portion 501a in the rightward indirect angular range 142b and by the second illumination portion 501b in the leftward indirect angular range 142b'.

According to some implementations the illumination device 500 may be configured to provide light in only one of the direct angular ranges 142a, 142a' and one of the indirect angular ranges 142b, 142b' or combinations thereof. Example combinations include {142a and 142b}, {142a' and 142b'}, {142a' and 142b}, {142a and 142b'}, {142a and 142a' and 142b}, and so forth.

An example implementation of the illumination device 500 is described below in connection with FIGS. 6A-6B. Example implementations of the first and/or second illumination portions 501a, 501b are described above in connection with FIGS. 3A-3G.

(vii-a) First Illumination Portion of the Illumination Device

The first illumination portion 501a includes one or more first LEEs 512a disposed on a first surface of the mount 510, one or more first primary optics 520a (e.g., first optical couplers), an optional first light guide 530a, and a first secondary optic 540a (e.g., first optical extractor). The first LEEs 512a emit light, during operation, in a first angular range 115a with respect to their optical axes, which can coincide with a normal to the first surface of the mount 510 (e.g., antiparallel to the x-axis). For example, a divergence of the first angular range 115a of the light emitted by the first LEEs 512a can be 150°-180° around optical axes of the first LEEs 512a. This may correspond with an illumination pattern with a full width half maximum of 30°, for example. The first primary optics 520a receive light in the first angular range 115a from the first LEEs 512a. Each first primary optic 520a is configured to redirect the light received in the first angular range 115a into a light with a second angular range 125a and direct it into a first end of first light guide 530a. For example, a divergence of the second angular range 125a of the light provided by the first primary optics 520a can be between about 40 to about 80°. When the first light guide 530a is not part of the first illumination portion 501a, the first primary optics 520a redirect the light with the second angular range 125a towards the first secondary optic 540a. The first light guide 530a can guide the light to a distal end of the first light guide 530a away from first LEEs 512a. The first light guide 530a provides the guided light at the distal end in a third angular range 135a. In some implementations, the first light guide 530a can be shaped to guide the light received from the first primary optics 520a in the second angular range 125a and to provide the guided light in substantially the same second angular range (angular range 135a≈angular range 125a) at the output end of the first light guide 530a. The first secondary optic 540a receives light with third angular range 135a that exits end of the first light guide 530a or, when the first light guide 530a is not part of the first illumination portion 501a, the first secondary optic 540a receives the light with second angular range 125a provided by the first primary optics 520a. The first secondary optic 540a redirects light received from the first primary optics 520a or the first light guide 530a to exit the first illumination portion 501a (indicated by arrows) with a rightward direct angular range 142a and a rightward indirect angular range 142b. The first secondary optic 540a includes redirecting surfaces as described above in connection with FIGS. 3A-3G. The rightward direct angular range 142a and rightward indirect angular range 142b at which light exits the first secondary optic 540a can depend on the properties of first secondary optic 540a (e.g., geometry of the optical interfaces and optical properties of the materials forming the first secondary optic 540a).

(vii-b) Second Illumination Portion of the Illumination Device

The second illumination portion 501b includes one or more second LEEs 512b disposed on a second surface of the mount 510, one or more second primary optics 520b (e.g., second optical couplers), an optional second light guide 530b, and a second secondary optic 540b (e.g., second optical extractor). The second LEEs 512b emit light, during operation, in a first angular range 115b with respect to their optical axes, which can coincide with a normal to the second surface of the mount 510 (e.g., parallel to the x-axis). For example, a divergence of the first angular range 115b of the light emitted by the second LEEs 512b can be 150°-180° around optical axes of the second LEEs 512b. This may correspond with an illumination pattern with a full width half maximum of 30°, for example. The second primary optics 520b receive light in the first angular range 115b from the second LEEs 512b. Each second primary optic 520b is configured to redirect the light received in the first angular range 115b into a light with a second angular range 125b and direct it into a first end of second light guide 530b. For example, a divergence of the second angular range 125b of the light provided by the second primary optics 520b can be between about 40 to about 80°. When the second light guide 530b is not part of the second illumination portion 501b, the second primary optics 520b redirect the light with the second angular range 125b towards the second secondary optic 540b. The second light guide 530b can guide the light to a distal end of the second light guide 530b away from second LEEs 512b. The second light guide 530b provides the guided light at the distal end in a third angular range 135b. In some implementations, the second light guide 530b can be shaped to guide the light received from the second primary optics 520b in the second angular range 125b and to provide the guided light in substantially the same second angular range (angular range 135b≈angular range 125b) at the output end of the second light guide 530b. The second secondary optic 540b receives light with third angular range 135b that exits end of the second light guide 530b or, when the second light guide 530b is not part of the second illumination portion 501b, the second secondary optic 540b receives the light with second angular range 125b provided by the second primary optics 520b. The second secondary optic 540b redirects light received from the second primary optics 520b or the second light guide 530b to exit the second illumination portion 501b (indicated by arrows) with a leftward direct angular range 142a' and a leftward indirect angular range 142b'. The second secondary optic 540b includes redirecting surfaces as described above in connection with FIGS. 3A-3G. The leftward direct angular range 142a' and leftward indirect angular range 142b' at which light exits the second secondary optic 540b can depend on the properties of second secondary optic 540b (e.g., geometry of the optical interfaces and optical properties of the materials forming the second secondary optic 540b).

(viii) Both Direct and Indirect Illumination Provided on Right and/or Left Sides of the Illumination Device The illumination device 500 allows a user to interdependently as well as independently power the first and second LEEs 512a, 512b. For instance, the intensity profile 141 illustrated in FIG. 1B corresponds to an intensity profile output by the illumination device 500 when both the first and second LEEs 512a, 512b are powered ON. Referring to FIG. 1B, lobes 142-DR and 142-IR of the light intensity profile 141 represent direct and indirect light output by the illumination device 500 to the right-side of the x-z cross-section of the illumination device 500 and respectively correspond to rightward direct angular range 142a and rightward indirect angular range 142b. Lobes 142-DL and 142-IL of the light intensity profile 141 represent direct and indirect light output by the illumination device 150 to the left-side of the x-z cross-section of the illumination device 150 and respectively correspond to leftward direct angular range 142a' and leftward indirect angular range 142b'.

FIG. 5B shows two instances of a light intensity profile of the illumination device 500. It is noted that contrary to a typical far field polar plot representation, the center of the intensity profiles for the illustrated lobes are offset to correspond with the notional origin of the direct angular ranges 142a, 142b and the indirect angular ranges 142a', 142b' illustrated in FIG. 6A, for example. A first instance 141-R of the light intensity profile corresponds to the illumination device 500 having the first LEEs 512a powered ON and the second LEEs 512b powered OFF (or dimmed with respect to the first LEEs 512a). In this first instance, lobes 142-DR and 142-IR of the light intensity profile 141-R represent direct and indirect light output by the illumination device 500 to the right side of the x-z cross-section of the illumination device 500 and respectively correspond to rightward direct angular range 142a and rightward indirect angular range 142b. A second instance 141-L of the light intensity profile corresponds to the illumination device 500 having the second LEEs 512b powered ON and the first LEEs 512a powered OFF (or dimmed with respect to the second LEEs 512b). In this second instance, lobes 142-DL and 142-IL of the light intensity profile 141-L represent direct and indirect light output by the illumination device 500 to the left side of the x-z cross-section of the illumination device 500 and respectively correspond to leftward direct angular range 142a' and leftward indirect angular range 142b'.

Figure 6A:
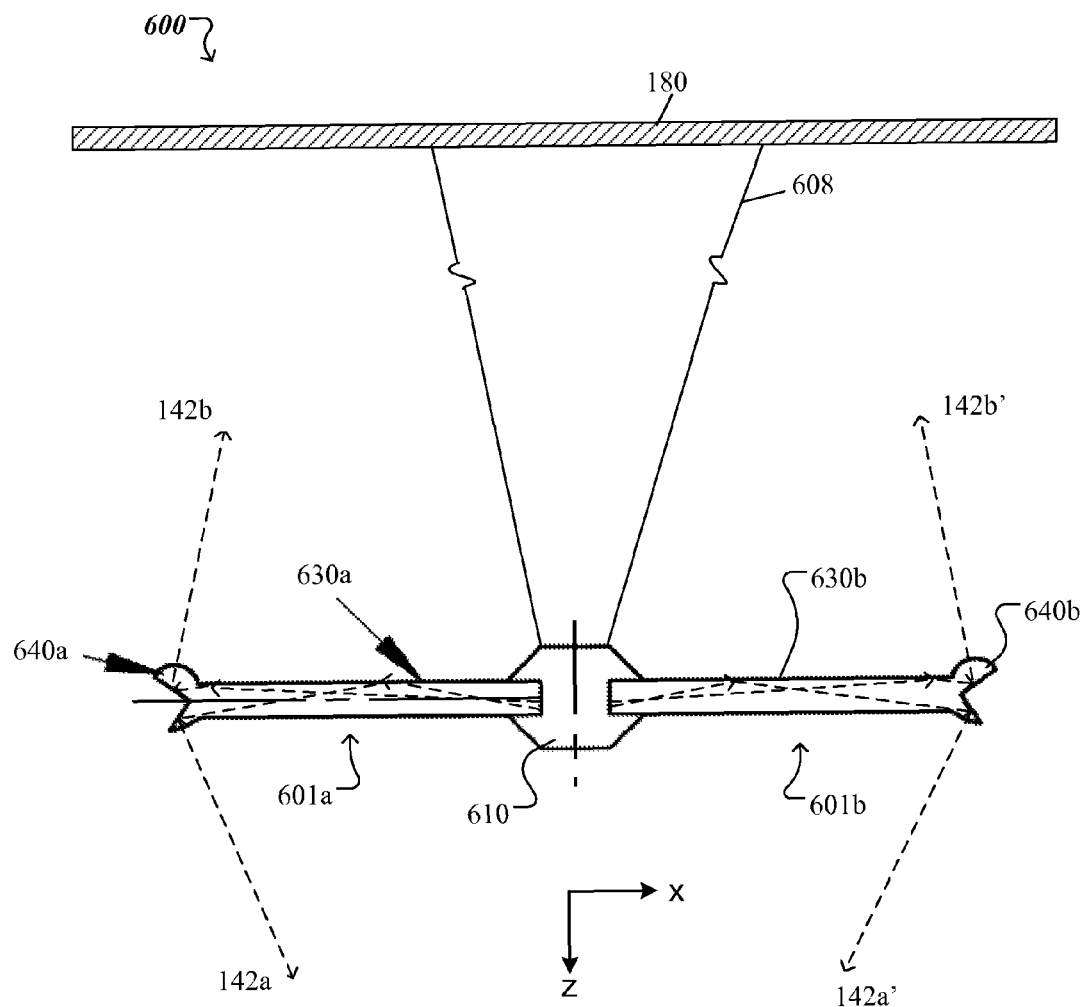
FIGS. 6A-6B show aspects of an implementation of the illumination device shown in FIG. 5A.
Figure 6B:
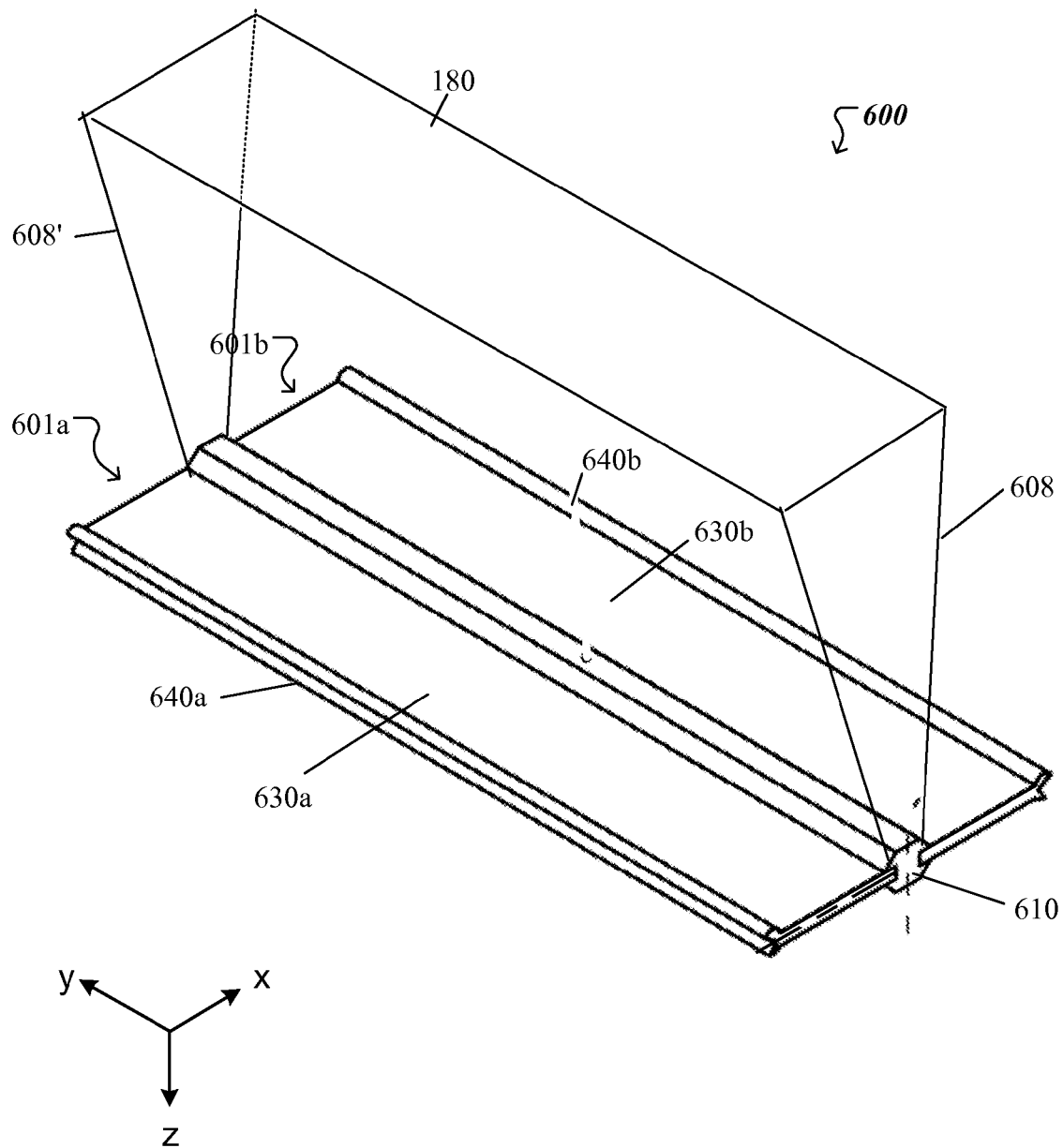

(ix) Example of Illumination Device Used to Provide Both Direct and Indirect Illumination on Right and/or Left Sides of the Illumination Device FIGS. 6A and 6B illustrate a sectional view and a perspective view, respectively, of an illumination device 600 used to provide both direct and indirect illumination on right and/or left sides of the illumination device 600. In this example, the illumination device 600 has an elongate configuration and is supported by a ceiling 180 through support suspension system 608, 608'. The coordinate system is oriented relative to the illumination device 600 such that light output by the illumination device 600 in each of rightward direct angular range 142a and rightward indirect angular range 142b has a prevalent propagation direction with a non-zero component that is parallel to the x-axis, and in each of leftward direct angular range 142a' and leftward indirect angular range 142b' has a prevalent propagation direction with a non-zero component that is antiparallel to the x-axis. The illumination device 600 provides direct and indirect illumination to a target surface (not illustrated in FIGS. 6A, 6B), which is spaced apart from the illumination device 600 in the positive direction of the z-axis.

The illumination device 600 includes a mount 610 that is elongated along the y-axis and supports a first portion 601a and a second portion 601b of the illumination device 600. The first portion 601a of the illumination device 600 is referred to as a first luminaire module 601a, and the second portion 601b of the illumination device 600 is referred to as a second luminaire module 601b. Both first and second luminaire modules 601a and 601b are elongated and can be equivalent to or similar with the luminaire module 301 described above in connection with FIG. 3A. The first and second luminaire modules 601a and 601b are supported by the mount 610 such that (i) elongations of the first and second luminaire modules 601a and 601b are along the elongation of the mount (in this example along the y-axis); (ii) direct illumination is provided to the target by the illumination device 600 with light output by the first luminaire module 601a in the rightward direct angular range 142a and by the second luminaire module 601b in the leftward direct angular range 142a'; and (iii) indirect illumination is provided to the target by the illumination device 600 with light output by the first luminaire module 601a in the rightward indirect angular range 142b and by the second luminaire module 601b in the leftward indirect angular range 142b'.

In this example, the first luminaire module 601a includes first LEEs and first primary optics arranged inside the mount 610 (and not shown in FIGS. 6A-6B.) Additionally, the first luminaire module 601a includes a first light guide 630a and a first secondary optic 640a. The first light guide 630a is configured to guide light, emitted by the first LEEs, from the first primary optics to the first secondary optic 640a. In some implementations, the portions of the redirecting surface and the output surfaces of the first secondary optic 440a are asymmetric in the x-z cross-section. In this case, the illumination device 600 outputs light in rightward direct angular range 142a and rightward indirect angular range 142b that are asymmetric with respect to a plane parallel to the x-y plane. In some asymmetric implementations, the first luminaire module 601a may be configured to provide only direct or only indirect illumination (not illustrated). In other implementations (not shown in FIGS. 6A-6B), the portions of the redirecting surface and the output surfaces of the first secondary optic 640a can be symmetric in an x-z cross-section (as shown in FIGS. 3A-3G, for instance). In this case, the illumination device 600 outputs light in the rightward direct angular range 142a and the rightward indirect angular range 142b that is symmetric with respect to a plane parallel to the x-y plane.

Further in this example, the second luminaire module 601b includes second LEEs and second primary optics arranged inside the mount 610 (and not shown in FIGS. 6A-6B.) Additionally, the second luminaire module 601b includes a second light guide 630b and a second secondary optic 640b. The second light guide 630b is configured to guide light, emitted by the second LEEs, from the second primary optics to the second secondary optic 640b. In some implementations, the portions of the redirecting surface and the output surfaces of the second secondary optic 640b can be asymmetric in the x-z cross-section. In this case, the illumination device 600 outputs light in leftward direct angular range 142a' and leftward indirect angular range 142b' that are asymmetric with respect to a plane parallel to the x-y plane. In some asymmetric implementations, the second luminaire module 601b may be configured to provide only direct or only indirect illumination (not illustrated). In other implementations (not shown in FIGS. 6A-6B), the portions of the redirecting surface and the output surfaces of the second secondary optic 640b are symmetric in an x-z cross-section (as shown in FIGS. 3A-3G, for instance). In this case, the illumination device 600 outputs light in the leftward direct angular range 142a' and the leftward indirect angular range 142b' that is symmetric with respect to a plane parallel to the x-y plane.

In some implementations, the mount 610 supports the first and second luminaire modules 601a, 601b to align side faces of the respective first and second light guides 630a, 630b with each other along a plane parallel with the x-y plane.

In some implementations, the mount 610 can be formed of extruded aluminum. In some implementations, a width of an x-z cross-section of the mount 610 is larger than the width of the x-z cross-section of the first and second light guides 630a, 630b. In this case, first and second LEEs can be disposed on two opposite sides of a substrate elongated along the y-axis and parallel to the y-z plane, and a heat-sink system can be offset along the z-axis with respect to an x-y plane that includes optical axes of the first and second LEEs. In other implementations, a width of an x-z cross-section of the mount 610 is substantially equal to the width of the x-z cross-section of the first and second light guides 630a, 630b, as shown in FIG. 3A, for instance. In this case, the first and second LEEs can be disposed on two substrates elongated along the y-axis, parallel to the y-z plane, and separated along the x-axis by a space which accommodates a heat-sink system. In either of the foregoing implementations, the first and second LEEs can be powered to emit light interdependently (e.g., concurrently) or independently (e.g., successively) from each other, as described in detail with respect to FIGS. 1B and 5B.

(x) General Aspects of Direct/Indirect (201a/201b) and/or First/Second (501a/501b) Illumination Portion of the Illumination Device Properties of the direct/indirect 201a/201b or first/second 501a/501b illumination portion can be tailored to provide extraction profiles desirable for specific lighting applications. It is noted that the angular ranges may be defined relative to one or more directions or planes, for example the z-axis, a plane perpendicular to x or other direction whether parallel, perpendicular or oblique to axes of a Cartesian coordinate system. In general, the components of direct/indirect 201a/201b or first/second 501a/501b illumination portion are arranged to redirect light emitted from the LEEs away from the LEEs before the light is emitted into the ambient environment. The spatial separation of the place of generation of the light, also referred to as the physical (light) source, from the place of extraction of the light, also referred to as the virtual light source or virtual filament, can facilitate design of the illumination device 200/500. For example, in some implementations, the virtual light source/filament can be configured to provide substantially non-isotropic light emission with respect to planes parallel to an optical axis of the illumination device 200/500 (for example the z-axis.) In contrast, a typical incandescent filament generally emits substantially isotropically distributed amounts of light. The virtual light source may be viewed as one or more portions of space from which substantial amounts of light appear to emanate. Furthermore, separating the LEEs, with their predetermined optical, thermal, electrical and mechanical constraints, from the place of light extraction, may facilitate a greater degree of design freedom of the optical system of the illumination device 200/500 and allows for an extended optical path, which can permit a predetermined level of light mixing before light is output from the illumination device 200/500.

In general, direct/indirect 201a/201b or first/second 501a/501b illumination portion is configured to emit direct/indirect light originating from corresponding LEEs. The LEEs may be organic or inorganic light-emitting diodes or a combination thereof.

In general, the illumination device 200/500 is configured to generate light of a desired chromaticity. In many applications, illumination device 200/500 is configured to provide broadband light. Broadband light can be generated using nominally white or off-white LEEs or colored LEEs whose emissions are mixed to provide white light. Alternatively, or additionally, white light can be generated using an LEE configured to emit pump light (e.g., blue, violet or ultra-violet light) in conjunction with a wavelength conversion material. For example, in certain implementations, LEEs include GaN-based pump LEDs with an overlying phosphor layer (e.g., YAG) that creates yellow, red and/or green components to produce white light. Such phosphor conversion LEDs can be included in different configurations in some implementations. For example, some implementations can include 3000 K CCT white LEEs and 2700 K white LEEs that can be independently controlled to maintain a desired CCT between about 2700 K and about 3000 K to mitigate ageing effects, drift or other effects, or to allow a user to vary the CCT within a respective CCT range.

In some implementations, the illumination device 200/500 may be configured to provide colored light (e.g., yellow, red, green, blue light). Different LEEs in the illumination device 200/500 can be configured to emit nominally different light under operating conditions, for example yellow, red, green, blue, white or other color light.

In general, relatively energy efficient LEEs can be used. For example, LEEs can have an output efficiency of about 50 lm/W or more (e.g., about 75 lm/W or more, about 100 lm/W, about 125 lm/W or more, about 150 lm/W or more). In certain implementations, LEEs conduct current greater than about 350 mA (e.g., 75 mA, 100 mA, 200 mA, 400 mA or more, 450 mA or more, 500 mA or more). LEEs may be surface mount devices.

The number of LEEs in an illumination device 200/500 can vary. In some implementations, the illumination device 200/500 can include relatively few LEEs (e.g., 10 or fewer). In some implementations, the illumination device 200/500 can include a large number of LEEs (e.g., 100 or more). In many applications, however, the illumination device 200/500 includes between 4 and 100 LEEs.

Each of the optical couplers is configured to receive light from one or more of the LEEs through an entrance aperture of the optical coupler. In implementations that feature multiple optical couplers, they may be integrally formed. Each optical coupler can be configured to provide a predetermined amount of light at an exit aperture of the optical coupler. For this purpose, each optical coupler is optically coupled with the corresponding LEEs and the light guide. Adjacent optical couplers may be optically isolated or optically coupled to control cross talk and/or collimation of light or other functions in one or more planes parallel to the optical axes of the optical couplers or in other directions.

The optical couplers are configured to allow coupling of a predetermined amount of light from one or more of the LEEs into the optical couplers and a predetermined amount of that light is provided at the exit apertures of the optical couplers.

Each optical coupler is configured to transform light as it interacts with the optical coupler between the entrance aperture and the exit aperture. Such transformations, also referred to as conditioning, may be regarded as transformations of the phase space of light including collimation of light (e.g. causing a reduction of the divergence of the coupled light) or other transformations, and/or preservation of etendue, light flux and/or other parameters, for example. In some implementations, the optical couplers are configured to provide light with predetermined properties to control light losses in other components of the illumination device, including one or more of the light guide, extractor or other components of the illumination device 200/500. For example, the optical couplers may be configured so that substantially all light provided thereby can propagate through the light guide to the optical extractor, has less than a predetermined divergence, is injected into the light guide at suitable angles relative to the optical interfaces of the light guide or has other properties.

Optical couplers can include one or more optical elements including non-imaging dielectric TIR concentrators, such as CPC (compound parabolic concentrators), CECs (compound elliptical concentrators), CHC (compound hyperbolic concentrators), tapered or untapered portions, light pipes, segmented concentrators, other geometry concentrators, one or more lenses or other optical elements, for example. In some implementations, optical couplers and LEEs are integrally formed as a single component.

The illumination device 200/500 may include a number of optical couplers with the same or different configuration. Optical couplers may have equal or different profiles or cross sections in different directions. In some implementations, optical couplers may have varying configurations depending on their location within a cluster or group of optical couplers. For example, optical couplers proximate the ends of an elongate illumination device may be configured with properties different from those of optical couplers near the center of the illumination device. Like considerations may apply in implementations in which the optical couplers are disposed in clusters proximate an optical axis. For example, optical couplers proximate the periphery of a cluster may be configured with properties different from those proximate the optical axis. An optical coupler may have rotationally symmetric and/or asymmetric cross sections, for example it may have parabolic, elliptical, circular, hyperbolic, triangular, square, rectangular, hexagonal or other regular or irregular polygonal or other cross sections.

A portion or all of the optical coupler may be made of a solid transparent body configured to propagate light internally and solely, partially or not at all, depending on whether a specular reflective coating is employed on the outside of the solid transparent body, rely on TIR, or may be configured to provide a through hole that is partially or fully reflectively coated on one or more optical surfaces. Like consideration may apply to the light guide, the optical extractors or other components of the illumination device, for example. Depending on the implementation, one or more optical couplers may be configured as hollow, reflectively coated non-imaging optical couplers. One or more of the optical couplers may include a dielectric collimating optic configured to provide a predetermined collimation angle. The collimation angle may be determined by the length and/or shape of respective surfaces of the optical coupler, for example. An optical coupler may be configured to provide substantially equal collimation about an optical axis in rotationally symmetrical configurations or may provide different collimation in different directions with respect to an optical plane of the optical coupler and/or other component of the illumination device, for example.

In general, a light guide can have a generally regular or irregular prismatic, cylindrical, cuboid or other shape and include one or more light guide elements. Light guide elements may be arranged in a line or a cluster that may or may not allow light to transmit between light guide elements. Light guide elements may be arranged in parallel with one light guide element for each coupler. Such configurations may be integrally formed. Multiple light guide elements may be arranged in a cluster, the light guide elements of the cluster coupling light into one or more extractors. Multiple light guide elements may be disposed abutting one another or placed apart at predetermined distances. The light guide and/or one or more light guide elements may be integrally formed, modularly configured, arranged and/or durably disposed via a suitably configured interconnect system during manufacture, installation, servicing or other event.

The light guide and/or one or more light guide elements may be configured to have one or more substantially reflective surfaces defining one or more mantles that extend from a first end to a second end of the light guide for enclosing and enabling optical confinement proximate an optical axis or optical plane along which the light guide can guide light with below predetermined light losses. One or more surfaces of the mantle may be substantially parallel, tapered or otherwise arranged. Such surfaces may be substantially flat or curved. Generally, the light guide can have elongate or non-elongate cross section with respect to an axes or planes of the illumination device. Non-elongate light guides may be rotationally or otherwise symmetric about an optical axis.

The light guide is configured to guide light from the one or more optical couplers via its optical surfaces, by total internal reflection (TIR) and/or specular reflection. Mixing of the light in the light guide elements may be achieved in part by the shape of the optical surfaces. The light guide may be configured to intermix light from different direct LEEs. In some implementations, the light guide is configured to mix light and to provide light with a predetermined uniformity in color and/or illuminance to the optical extractor.

In some implementations, the light guide has a hollow configuration having reflective optical surfaces on its inside that transmit light along the length of the hollow with predetermined light-loss properties. The reflectivity of the reflective optical surfaces may originate from or be enhanced by reflective coatings, films, layers or other reflective aids. The composition of and manner in which such reflective coatings may be disposed and/or manufactured would be readily known by a person skilled in the art.

An optical extractor is disposed at an end of the light guide opposite the optical coupler and includes one or more reflective interfaces that are configured to redirect light from the light guide outward away from the optical axis of the light guide towards and through one or more light-exit surfaces of the optical extractor into the ambient. Depending on the implementation, the directions of propagation of the emitted light may be parallel, antiparallel and/or oblique, that is backward and/or forward, with respect to the optical axis of the light guide.

The optical extractor may be configured to emit one or more beams of light with predetermined intensity distributions (i.e., into specific ranges of solid angles). For example, different intensity distributions may be provided via different light-exit surfaces, for example on either side of an elongate optical extractor. The optical extractor and/or one or more portions thereof from which light appears to emanate under operating conditions may be referred to as a virtual light source. Depending on the implementations, the virtual light source can have an elongate or non-elongate configuration. The one or more beams may be symmetric or asymmetric with respect to the illumination device 200/500. A non-elongate configuration may have rotational symmetry about an optical axis. The intensity distributions or one or more portions thereof may be configured to limit glare by limiting direct downward lighting to predetermined levels, for example.

In some implementations, the intensity distribution of the optical extractor, at least in part, may be determined by the configuration and disposition of the reflective interfaces relative to the light-exit surfaces of the optical extractor. The optical extractor may include one or more reflective interfaces having one or more flat or curved shapes including parabolic, hyperbolic, circular, elliptical or other shapes. In certain implementations, the optical extractor includes one or more reflective coatings to redirect light and provide a desired emission pattern. The reflective interface may have a linear, convex, concave, hyperbolic, linear segmented or other cross section shaped as a plurality of potentially disjoint, piecewise differentiable curves, in order to achieve a predetermined emission pattern. In general, the optical extractor may provide symmetrical or asymmetrical beam distributions with respect to an optical axis or optical plane thereof. In elongate implementations the cross sections of reflective interfaces and/or light-exit surfaces may change along an elongate extension thereof. Such variations may be stepwise or continuous. For instance, the reflective interface of the optical extractor may have a first cross section shaped as a plurality of potentially disjoint, piecewise differentiable first curves, and a second cross section at a different location along the elongate extension of the reflective interface, such that the second cross section is shaped as a different plurality of potentially disjoint, piecewise differentiable second curves.

In certain implementations, the reflective optical interfaces may have a symmetrical or asymmetrical v-shaped or other cross section. A v-shaped cross section may also be referred to as a v-groove in elongate implementations or a conical cavity in non-elongate implementations. As used herein, the term "v-groove" refers to the v-shaped cross-section through the reflective optical interfaces, but does not require that the optical extractor include an actual groove. For example, in some implementations, the optical extractor includes two portions of solid material that meet at a v-shaped interface. Such an interface is also referred to as a v-groove. Depending on the implementation, a v-groove may have substantially equal cross section along a length of the optical extractor or it may vary depending on the position along the elongate extension. The first apex formed by such v-shaped reflective interfaces may be generally directed towards the light guide. In addition, the sides forming the v-groove may have linear cross-sections, or may be non-linear (e.g., curved or faceted). Moreover, the first apex of the reflective optical interfaces can be a rounded vertex (or apex) with a non-zero radius of curvature.

Generally, the optical extractor can be integrally or modularly formed with the light guide. The optical extractor may be formed of one or more materials equal, similar or dissimilar to that of the light guide and include one or more different materials. Depending on the implementation, the optical extractor may be configured to redirect light via TIR, specular and/or diffuse reflection, for example, via a dielectric or metallic mirror surface, refraction and/or otherwise. The optical extractor may include one or more coatings including one or more films of suitable dielectric, metallic, wavelength conversion material or other material. Depending on the implementation, a modularly formed optical extractor and light guide may include or be interconnected with suitable connectors for durable interconnection and optional registration during manufacture, assembly, service or other event. Different modular optical extractors may have different configurations to provide different lighting properties. To improve optical and/or mechanical performance, a coupling between the optical extractor and the light guide may be established by employing one or more suitably transparent compounds with predetermined refractive indices. Such compounds may include at least initially fluid substances such as silicone or other curable or non-curable substances. Such substances may provide an adhesive function.

Each of the light-exit surfaces and/or the reflective interfaces of the optical extractor may include one or more segments, each having a predetermined shape including convex, concave, planar or other shape. Shapes of the light-exit surface and/or the reflective interfaces can be determined to provide predetermined levels of light extraction via the optical extractor and to limit light losses due to back reflection and/or absorption of light within the optical extractor.

The term "optical axis" is used herein to refer to an imaginary line that defines a path along or proximate which light propagates. An optical axis may correlate with one or more axes or planes of symmetry of components of an optical system or apparatus. A plurality of optical axes that refer to a planar or non-planar notional surface may be referred to herein as an optical plane. The term "rotational symmetry" is used herein, as the case may be, to refer to invariance under discrete or continuous rotation.

The term "light-emitting element" (LEE), also referred to as a light emitter, is used to define any device that emits radiation in one or more regions of the electromagnetic spectrum from among the visible region, the infrared region and/or the ultraviolet region, when activated. Activation of an LEE can be achieved by applying a potential difference across components of the LEE or passing a current through components of the LEE, for example. A light-emitting element can have monochromatic, quasi-monochromatic, polychromatic or broadband spectral emission characteristics. Examples of light-emitting elements include semiconductor, organic, polymer/polymeric light-emitting diodes (e.g., organic light-emitting diodes, OLEDs), other monochromatic, quasi-monochromatic or other light-emitting elements. Furthermore, the term light-emitting element is used to refer to the specific device that emits the radiation, for example a LED die, and can equally be used to refer to a combination of the specific device that emits the radiation (e.g., a LED die) together with a housing or package within which the specific device or devices are placed. Examples of light emitting elements include also lasers and more specifically semiconductor lasers, such as vertical cavity surface emitting lasers (VCSELs) and edge emitting lasers. Further examples include superluminescent diodes and other superluminescent devices.

The term "light-converting material" (LCM), also referred to as "wavelength-conversion material" is used herein to define a material that absorbs photons according to a first spectral distribution and emits photons according to a second spectral distribution. The terms light conversion, wavelength conversion and/or color conversion are used accordingly. Light-converting material may be referred to as photoluminescent or color-converting material, for example. Light-converting materials may include photoluminescent substances, fluorescent substances, phosphors, quantum dots, semiconductor-based optical converters, or the like. Light-converting materials may include rare earth or other materials including, for example, Ce, Yt, Te, Eu and other rare earth elements, Ce:YAG, TAG, nitride, oxynitride, silicate, CdSe quantum dot material, AlInGaP quantum dot material. As used herein, an LCM is typically configured to generate longer wavelength light from pump light such as visible light or ultraviolet pump light, for example. Different LCM may have different first and/or second spectral distributions.

As used herein, the term "optical interface" refers to the interface between two media having different optical properties. Examples of optical interfaces include a surface of an optical element (i.e., the interface between the medium forming the optical element and the ambient atmosphere), the interface between adjacent optical elements, and the interface between an optical element and a coating disposed on the elements surface.

As used herein, the term "optical power" (also referred to as dioptric power, refractive power, focusing power, or convergence power) is the degree to which a lens, mirror, or other optical system converges or diverges light.

As used herein, providing light in an "angular range" refers to providing light that propagates in a prevalent direction and has a divergence with respect to the propagation direction. In this context, the term "prevalent direction of propagation" refers to a direction along which a portion of an intensity distribution of the propagating light has a maximum. For example, the prevalent direction of propagation associated with the angular range can be an orientation of a lobe of the intensity distribution. Also in this context, the term "divergence" refers to a solid angle outside of which the intensity distribution of the propagating light drops below a predefined fraction of a maximum of the intensity distribution. For example, the divergence associated with the angular range can be the width of the lobe of the intensity distribution. The predefined fraction can be 50%, 10%, 5%, 1%, or other values, depending on the lighting application.

An angular range may include (i) a divergence of the angular range and (ii) a prevalent direction of propagation of light in the angular range, where the prevalent direction of propagation corresponds to a direction along which a portion of an emitted light intensity distribution has a maximum, and the divergence corresponds to a solid angle outside of which the intensity distribution drops below a predefined fraction of the maximum of the intensity distribution. E.g., the predefined fraction is 5%.

The terms "collimation" and "collimate" are used herein to refer to the degree of alignment of rays of light or the act of increasing such alignment including the reduction of divergence of the propagation directions of a plurality of light rays, also referred to as a beam of light, or simply light.

The term "partially collimate" may be understood as that that the light exiting the optic that performs the partial collimation has a smaller divergence compared to the light when it entered the optic. The light may then be more directed and less spreading. Collimation of the light may mean that the light is focused towards infinity. Partial collimation of the light may be understood that as a covered distance of the light emitted by the optic performing the partial collimation increases, the wavefronts of the light become flatter and closer to plane waves. Partial collimation may be reached for a rectangular forward field-of-view (FOV) of FWHM 40 degrees or for better than FWHM 20 degrees or better than FWHM 25 degrees.

Unless defined otherwise, all technical and scientific terms used herein have the same meaning as commonly understood by one of ordinary skill in the art to which this technology belongs. To the extent there is conflict with any document incorporated herein by reference, the present specification, including definitions, controls.

The preceding figures and accompanying description illustrate example methods, systems and devices for illumination. It will be understood that these methods, systems, and devices are for illustration purposes only and that the described or similar techniques may be performed at any appropriate time, including concurrently, individually, or in combination. In addition, many of the steps in these processes may take place simultaneously, concurrently, and/or in different orders than as shown. Moreover, the described methods/devices may use additional steps/parts, fewer steps/parts, and/or different steps/parts, so long as the methods/devices remain appropriate.

In other words, although this disclosure has been described in terms of certain aspects or implementations and generally associated methods, alterations and permutations of these aspects or implementations will be apparent to those skilled in the art. Accordingly, the above description of example implementations does not define or constrain this disclosure. Further implementations are in the following claims.

What is claimed is:

1. An illumination system comprising:
    multiple light emitting elements (LEEs);
    a first light guide extending along a first plane, the first light guide being positioned and arranged to receive light from at least some of the LEEs and guide the light in a first direction in the first plane;
    a second light guide extending along the first plane, the second light guide being positioned and arranged to receive light from at least some other of the LEEs and guide the light in a second direction in the first plane opposite to the first direction;
    a first redirecting optic positioned and arranged to receive light from the first light guide and direct the light in a first angular range and a second angular range; and
    a second redirecting optic positioned and arranged to receive light from the second light guide and direct the light in a third angular range and a fourth angular range,
    wherein each of the light guides and the redirecting optics has a longitudinal dimension that is (i) parallel to the first plane and (ii) orthogonal to the first and second directions,
    wherein the LEEs are distributed along the longitudinal dimension, and
    wherein the first, second, third and fourth angular ranges are different, such that
        each of prevalent propagation directions of the first angular range and the second angular range has a component that is opposite the first direction, and
        each of prevalent propagation directions of the third angular range and the fourth angular range has a component that is opposite the second direction.

2. The illumination system of claim 1, wherein
    the first angular range and the second angular range are symmetrical with respect to the first plane, and
    the third angular range and the fourth angular range are symmetrical with respect to the first plane.

3. The illumination system of claim 1, wherein
    the first angular range and the third angular range are symmetrical with respect to a second plane that (i) is orthogonal to the first plane and (ii) contains the longitudinal dimension, and
    the second angular range and the fourth angular range are symmetrical with respect to the second plane.

4. The illumination system of claim 1, further comprising a power controller arranged and configured to power the multiple LEEs dependently or independently.

5. The illumination system of claim 4, wherein the at least some of the multiple LEEs from which the first light guide receives the light are controlled independently from the at least some other of the multiple LEEs from which the second light guide receives the light.

6. The illumination system of claim 1, wherein the multiple LEEs comprise light-emitting diodes.

* * * * *